(12) United States Patent
Naka et al.

(10) Patent No.: US 6,700,524 B2
(45) Date of Patent: Mar. 2, 2004

(54) A/D CONVERTER FOR PERFORMING PIPELINE PROCESSING

(75) Inventors: Junichi Naka, Neyagawa (JP); Yoichi Okamoto, Hirakata (JP); Yoshitsugu Inagaki, Osaka (JP); Kenji Murata, Katano (JP); Koji Oka, Mishima-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/256,238

(22) Filed: Sep. 27, 2002

(65) Prior Publication Data

US 2003/0058150 A1 Mar. 27, 2003

(30) Foreign Application Priority Data

Sep. 27, 2001 (JP) ........................................ 2001-295283

(51) Int. Cl.[7] .............................................. H03M 1/38
(52) U.S. Cl. ........................ 341/161; 341/155; 341/120
(58) Field of Search ................................. 341/155, 120, 341/161

(56) References Cited

U.S. PATENT DOCUMENTS

| | | | | |
|---|---|---|---|---|
| 5,510,789 A | * | 4/1996 | Lee ............................. | 341/120 |
| 5,623,533 A | | 4/1997 | Kikuchi et al. ............... | 379/58 |
| 5,635,937 A | * | 6/1997 | Lim et al. ..................... | 341/161 |
| 6,184,809 B1 | * | 2/2001 | Yu .............................. | 341/120 |
| 6,456,211 B2 | * | 9/2002 | Wu et al. ..................... | 341/120 |
| 6,486,807 B2 | * | 11/2002 | Jonsson ....................... | 341/120 |

FOREIGN PATENT DOCUMENTS

| | | |
|---|---|---|
| JP | 6-85672 | 3/1994 |
| JP | 10173528 A | 6/1998 |

OTHER PUBLICATIONS

Gustavsson et al., "CMOS Data Converters for Communications", Chapter 9, pp. 229–256, Mar. 24, 2000.

* cited by examiner

Primary Examiner—Michael Tokar
Assistant Examiner—Lam T. Mai
(74) Attorney, Agent, or Firm—Parkhurst & Wendell, L.L.P.

(57) ABSTRACT

An A/D converter comprises a pipeline stage array in which plural pipeline stages are connected in series, each pipeline stage performing a pipeline operation on an inputted analog voltage to output a digital voltage; a number-of-bits control circuit for outputting a number-of-bits selection signal which indicates whether the operation of each pipeline stage should be carried out or halted, according to a number-of-bits control signal which indicates a resolution; and a correction circuit for compensating a digital value to be output, according to the number-of-bits control signal. Therefore, when resolution of the A/D converter, which is requested by the system, is changed, only the pipeline stages required for realizing the requested resolution are operated while the other pipeline stages are halted, whereby a reduction in power consumption of the A/D converter is realized and, simultaneously, a breakdown of an output from the A/D converter is avoided.

4 Claims, 16 Drawing Sheets

Fig.23 (a)

$$\begin{array}{l}M_1L_1\\M_2L_2\\M_3L_3\\\underline{M_4L_4}\\D_4D_3D_2D_1D_0\end{array}$$

normal operation

Fig.23 (b)

$$\begin{array}{l}M_1L_1\\M_2L_2\\M_3L_3\\\underline{C_{out}}\\D_4D_3D_2D_1*\end{array}$$

4th pipeline stage being halted

Fig.23 (c)

$$\begin{array}{l}M_1L_1\\M_2L_2\\\underline{C_{out}}\\D_4D_3D_2**\end{array}$$

3rd and 4th pipeline stages being halted

Fig.23 (d)

$$\begin{array}{l}M_1L_1\\\underline{C_{out}}\\D_4D_3***\end{array}$$

2nd, 3rd, and 4th pipeline stages being halted

Fig.23 (e)

$$\underline{C_{out}}\atop D_4****$$

all pipeline stages being halted

| Fig.24 (a) | Fig.24 (b) | Fig.24 (c) | Fig.24 (d) |
|---|---|---|---|
| $M_1L_1$ | $M_1L_1$ | $M_1L_1$ | $M_4L_4$ |
| $M_2L_2$ | $M_2L_2$ | $M_4L_4$ | |
| $M_3L_3$ | $M_4L_4$ | | $\overline{D_4 D_3 * * *}$ |
| $\overline{M_4L_4}$ | $\overline{\phantom{M_4L_4}}$ | $\overline{D_4 D_3 D_2 * *}$ | |
| $D_4 D_3 D_2 D_1 D_0$ | $D_4 D_3 D_2 D_1 *$ | | |
| normal operation | 3rd pipeline stage being halted | 2nd and 3rd pipeline stages being halted | 1st, 2nd, and 3rd pipeline stages being halted |

A/D CONVERTER FOR PERFORMING PIPELINE PROCESSING

FIELD OF THE INVENTION

The present invention relates to an A/D converter and, more particularly, to an A/D converter performing pipeline processing, which can vary resolution.

BACKGROUND OF THE INVENTION

With digitization and speedup of signal processing in information communication fields as well as downsizing and weight-reduction of information communication devices, speedup and reduction in power consumption are required of A/D converters which become key devices in digital signal processing. In recent years, a pipeline A/D converter has increasingly been employed as a configuration of an A/D converter to meet the requirements. First of all, the construction and operation of a conventional pipeline A/D converter will be described.

FIG. 17 is a block diagram illustrating a general pipeline A/D converter of 5-bit output, using three pipeline stages of 1.5-bit output, and a final pipeline stage of 2-bit output (refer to Japanese Published Patent Application No. Hei.6-85672, Japanese Published Patent Application No. Hei.10-173528, and "CMOS DATA CONVERTERS FOR COMMUNICATIONS" by Mikael Gustavsson, J. Jacob Wikner, Nianxiong Nick Tan, KLUWER ACADEMIC PUBLISHERS (ISBN-0-7923-7780-X)).

The pipeline A/D converter is supplied with an analog input signal 1 as an input, and outputs a digital output signal 2. The analog input signal 1 indicated by a partial analog voltage value P0 is connected to a first pipeline stage 3. An output of the first pipeline stage 3, which is indicated by a partial analog voltage value P1, is connected to a second pipeline stage 4. An output of the second pipeline stage 4, which is indicated by a partial analog voltage value P2, is connected to a third pipeline stage 5. An output of the third pipeline stage 5, which is indicated by a partial analog voltage value P3, is connected to a fourth pipeline stage 6. On the other hand, partial digital values M1L1–M4L4 obtained in the respective pipeline stages are connected to a coding circuit 7. There is a case where the analog input signal 1 is connected to the first pipeline stage 3 via a sampling/hold circuit (not shown). The foregoing is the construction of the pipeline A/D converter.

Next, a description will be given of the operation of the pipeline A/D converter for converting the analog voltage values into the digital values. When the analog input signal 1 indicated by the partial analog voltage value P0 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the coding circuit 7 and the second pipeline stage 4, respectively.

Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the coding circuit 7 and the third pipeline stage 5, respectively. Likewise, when the partial analog voltage value P2 is input to the third pipeline stage 5, the third pipeline stage 5 outputs the partial digital value M3L3 which is a binary code having 1.5 bits of information, and the partial analog voltage value P3, according to the partial analog voltage value P2. The partial digital value M3L3 and the partial analog voltage value P3 are input to the coding circuit 7 and the third pipeline stage 6, respectively. Further, when the partial analog voltage value P3 is input to the fourth pipeline stage 6, the fourth pipeline stage 6 outputs the partial digital value M4L4 which is a binary code having 2 bits of information and constitutes a least significant bit, according to the partial analog voltage value P3. The partial digital value M4L4 is input to the coding circuit 7.

The partial digital value L1 and the partial digital value M2, the partial digital value L2 and the partial digital value M3, and the partial digital value L3 and the partial digital value M4 have overlap portions (0.5 bit), respectively, to increase reliability in the conversion process, and the digital output signal 2 which is a binary code and has 5-bit resolution is consequently outputted by coding these digital values in the coding circuit 7. The foregoing is the operation of the pipeline A/D converter.

Next, a description will be given of the constructions and operations of the general pipeline stages constituting the conventional pipeline A/D converter.

Hereinafter, the constructions of the i-th (first to fourth) pipeline stages will be described.

FIG. 18 is a block diagram illustrating the specific construction of each of the first to third pipeline stages 3–5 shown in FIG. 17. Each of the first to third pipeline stages 3–5 is supplied with, as an input, a first partial analog voltage value 8 indicated by Pi−1, and outputs a partial digital value 9 indicated by MiLi, and a second partial analog voltage value 10 indicated by Pi. The first partial analog voltage value 8 is connected to a first offset addition unit 11, an output of the first offset addition unit 11 is connected to a partial A/D converter 12, an output of the partial A/D converter 12 is connected to a partial D/A converter 13, an output of the partial D/A converter 13 is connected to a second offset addition unit 14, an output of the second offset addition unit 14 and the first partial analog voltage value 8 are connected to a subtracter 15, an output of the subtracter 15 is connected to an arithmetic amplifier 16, an output of the arithmetic amplifier 16 becomes the second partial analog voltage value 10, and an output of the partial A/D converter 12 becomes the partial digital value 9.

On the other hand, FIG. 19 is a block diagram illustrating the specific construction of the fourth pipeline stage 6 shown in FIG. 17. The fourth pipeline stage 6 is supplied with, as an input, a first partial analog voltage value 8 indicated by Pi−1, and outputs a partial digital value 9 indicated by MiLi. The first partial analog voltage value 8 is connected to a partial A/D converter 12. An output of the partial A/D converter 12 becomes the partial digital value 9. The foregoing is the constructions of the pipeline stages.

Hereinafter, the operations of the i-th (first to fourth) pipeline stages will be described.

In each of the first to third pipeline stages 3–5, the first offset addition unit 11 adds an offset voltage value equivalent to −0.5 LSB, as a first offset voltage value 17, to the Pi−1 that is the inputted first partial analog voltage value 8, and the A/D converter 12 performs A/D conversion on the Pi−1, thereby outputting, as the partial digital value 9, [00,01,10] which are binary codes each corresponding to 1.5-bit output and having Mi as a higher-order bit and Li as a lower-order bit. Further, the partial D/A converter 13 performs D/A conversion on the partial digital value 9, and the second offset addition unit 14 adds an offset voltage value equivalent to +0.5 LSB, as a second offset voltage value 18, to a result of the D/A conversion. Then, the output from the second offset voltage value 18 and the first partial analog voltage value 8 are input to the subtracter 15, and a difference voltage value between them is obtained, and the difference voltage value is amplified by the arithmetic amplifier 16, thereby obtaining the Pi as the second partial analog voltage value 10. The foregoing is the operation of each of the first to third pipeline stages 3–5.

FIG. 20 is a diagram illustrating relationships of the first partial analog voltage value Pi1 which is an input to each of the first to third pipeline stages 3–5, to the partial digital value MiLi and the second partial analog voltage value Pi which are outputs from each of the first to third pipeline stages 3–5. Although, in FIG. 20, a GND level is employed as a reference level of the first and second partial analog voltage values, the reference level may be arbitrarily set. Further, FS indicates a full-scale voltage value of the first to third pipeline stages 3–5.

On the other hand, in the fourth pipe line stage 6, the partial A/D converter 12 performs A/D conversion on the Pi−1 that is the first partial analog voltage value 8, thereby outputting, as the partial digital value 9, [00,01,10,11] which are binary codes each corresponding to 2-bit output and having Mi as a higher-order bit and Li as a lower-order bit. The foregoing is the operation of the fourth pipeline stage 6.

FIG. 21 is a diagram illustrating a relationship between the first partial analog voltage value Pi−1 that is an input to the fourth pipeline stage 6 and the partial digital value MiLi that is an output from the fourth pipeline stage 6. Although, in FIG. 21, a GND level is employed as a reference level of the first partial analog voltage value, the reference level may be arbitrarily set, as described for the first to third pipeline stages 3–5. Further, FS indicates a full-scale voltage value of the fourth pipeline stage 6. The operations of the pipeline stages are as described above.

Next, the construction and operation of the general coding circuit as a component of the pipeline A/D converter will be described in detail.

FIG. 22 is a block diagram illustrating the construction of the coding circuit 7. The coding circuit 7 receives the partial digital values M1L1–M3L3 which are outputted from the first to third pipeline stages 3–5, each value being constituted by a binary code of 1.5 bits, and the partial digital value M4L4 which is outputted from the fourth pipeline stage 6 and is constituted by a binary code of 2 bits, and the coding circuit 7 outputs the digital output signal 2 (D4–D0).

The partial digital value M1 is connected to an A1 terminal as an input terminal of a half adder 19, and the partial digital value L1 is connected to an A2 terminal as an input terminal of a full adder 20. The partial digital value M2 is connected to a B2 terminal as an input terminal of the full adder 20, and the partial digital value L2 is connected to an A3 terminal as an input terminal of the full adder 21. The partial digital value M3 is connected to a B3 terminal as an input terminal of the full adder 21, and the partial digital value L3 is connected to an A4 terminal as an input terminal of the half adder 22. The partial digital value M4 is connected to a B4 terminal as an input terminal of the half adder 22, and the partial digital value L4 becomes D0 that is a least significant bit of the digital output signal 2.

Further, a result of addition S4 from the half adder 22 becomes D1 that is the second bit of the digital output signal 2. A carry signal Co4 from the half adder 22 is connected to a carry signal input terminal Ci3 of the full adder 21. A result of addition S3 from the full adder 21 becomes D2 that is the third bit of the digital output signal 2. A carry signal Co3 from the full adder 21 is connected to a carry signal input terminal Ci2 of the full adder 20. A result of addition S2 from the full adder 20 becomes D3 that is the fourth bit of the digital output signal 2. A carry signal Co2 from the full adder 20 is connected to an input terminal B1 of the half adder 19. A result of addition S1 from the half adder 19 becomes D4 that is a most significant bit of the digital output signal 2.

The A1 to A4 terminals and the B1 to B4 terminals as the input terminals of the half adders and the full adders are interchangeable, and the above-described connections are not necessarily required. Further, although the coding circuit 7 is constituted by the half adders and the full adders, it may be constituted by other logic circuits. The foregoing is the construction of the coding circuit 7.

Next, the operation of the coding circuit 7 will be described. The coding circuit 7 outputs the partial digital value L4 as the least significant bit D0 of the digital output signal 2. Further, the half adder 22 adds the partial digital value M4 and the partial digital value L3, and a result of addition is outputted as the second bit D1 of the digital output signal 2. At this time, if a carry occurs, a carry signal is sent to the full adder 21. Further, the full adder 21 adds the partial digital value M3, the partial digital value L2, and the carry signal of the half adder 22, and a result of addition is outputted as the third bit D2 of the digital output signal 2. When a carry occurs, a carry signal is sent to the full adder 20. Further, the full adder 20 adds the partial digital value M2, the partial digital value L1, and the carry signal of the full adder 21, and a result of addition is outputted as the fourth bit D3 of the digital output signal 2. When a carry occurs, a carry signal is sent to the half adder 19. Further, the half adder 19 adds the partial digital value M1 and the carry signal of the total adder 20, and a result of addition is outputted as the most significant bit D4 of the digital output signal 2. The foregoing is the operation of the coding circuit.

The conventional A/D converter is constructed as described above. Since a mobile communication device such as a handy phone is driven by a battery or the like, reduction in power consumption is required of an A/D converter which is employed in a circuit for improving communication quality in digital communication, for downsizing and weight-reduction of the mobile communication device and long-hours drive of the battery or the like. On the other hand, when the mobile communication device receives information, the intensity of radio wave to be received varies due to obstructions such as buildings or a change in communication distance from a base station to the mobile communication device, and therefore, resolution required of the A/D converter varies according to variations in the radio wave intensity that depends on the place where the device is used.

In the conventional pipeline A/D converter described above, however, the number of bits in the digital output does not change even when the resolution requested by the mobile communication system changes, and all of the pipeline stages are operated, resulting in an impediment to reduction in power consumption of the A/D converter.

On the other hand, in order to solve the above-mentioned problem, Japanese Published Patent Application No. Hei.6-85672 proposes a pipeline A/D converter which can vary resolution of a digital value to be output, by halting operations of A/D converters for determining lower-order bits, according to a given request signal.

However, as described above, in the construction of the pipeline A/D converter which is commonly used at present, the digital output of each pipeline stage has an overlap portion with the digital output of the pipeline stage constituting the higher-order bit, and therefore, the higher-order bit cannot be determined until the lower-order bit is determined. For example, when [M1L1,M2L2,M3L3] are [01,01,01] as shown in FIG. 26(a), [0111] is outputted as an arithmetic result. However, when [M1L1,M2L2,M3L3] are [01,01,10] as shown in FIG. 26(b), an arithmetic result, which should be [1000] actually, becomes [011] because [M3L3] is unknown by halting the pipeline stage 5. In this way, since the output of the most significant bit might be determined by the output of the least significant bit, if the operation of the A/D converter for determining the lower-order bit is simply halted, the requested resolution cannot be realized and, worse yet, a breakdown might occur in the output from the A/D converter.

SUMMARY OF THE INVENTION

The present invention is made to solve the above-described problems and has for its object to provide a pipeline A/D converter which can operate with reduced power consumption, by driving only pipeline stages that are required for realizing requested resolution while halting pipeline stages that are not required for realizing the resolution, when resolution of the A/D converter requested by the system is changed, and further, an A/D converter which can prevent a breakdown in an output from the A/D converter, which breakdown might occur when the operations of the unnecessary pipeline stages are halted.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an A/D converter comprises a pipeline stage array in which plural pipeline stages are connected in series, each pipeline stage performing a pipeline operation on an inputted analog voltage to output a digital voltage; a number-of-bits control circuit for outputting a number-of-bits selection signal which indicates whether the operation of each pipeline stage should be carried out or halted, according to a number-of-bits control signal which indicates a resolution; and a correction circuit for compensating a digital value to be output, according to the number-of-bits control signal. Therefore, when resolution of the A/D converter which is requested by the system is changed, only the pipeline stages required for realizing the requested resolution are operated while the other pipeline stages are halted, whereby a reduction in power consumption of the A/D converter is realized and, simultaneously, resolution of a digital value to be output can be compensated by the correction circuit, resulting in an A/D converter that never causes a breakdown of an output from the A/D converter.

According to a second aspect of the present invention, in the A/D converter according to the first aspect, the correction circuit comprises a correction A/D converter for receiving inputs of all of the pipeline stages, comparing an input that is selected from the inputs according to the number-of-bits selection signal, with a reference voltage value, and outputting a result of comparison as a partial digital value for correction which comprises at least one binary code; and a correction code conversion circuit for receiving the partial digital values which are outputted from all of the pipeline stages in the pipeline stage array, and the partial digital value for correction which is outputted from the correction A/D converter, and outputting at least one binary code according to the number-of-bits selection signal. Therefore, when resolution of a digital output signal which is requested by the system changes over a range of 1–N bits, a series of pipeline operations performed at the pipeline stages whose operations are not needed can be halted, without causing a breakdown of data output.

According to a third aspect of the present invention, in the A/D converter according to the first aspect, the correction circuit comprises a selection means for selecting an analog voltage value to be processed in a final pipeline stage, from among analog voltage values which are outputted from the plural pipeline stages except the final pipeline stage, according to the number-of-bits selection signal; and a correction code conversion circuit for receiving the partial digital value outputted from the final pipeline stage, and the partial digital values outputted from the respective pipeline stages in the pipeline stage array other than the final pipeline stage, and outputting corrected binary codes according to the number-of-bits selection signal. Therefore, when resolution of a digital output signal which is requested by the system changes over a range of 2–N bits, a series of pipeline operations performed at the pipeline stages whose operations are not needed can be halted, without causing a breakdown of data output.

According to a fourth aspect of the present invention, in the A/D converter according to the first aspect, the correction circuit comprises an offset control means for determining as to whether offset addition should be performed or not in the plural pipeline stages except the final pipeline stage, according to the number-of-bits control signal, and controlling the plural pipeline stages so as to output corrected binary codes. Therefore, when resolution of a digital output signal which is requested by the system changes over a range of 1–N–2 bits, or to N bits, a series of pipeline operations performed at the pipeline stages whose operations are not needed can be halted, without causing a breakdown of data output.

BRIEF DESCRIPTION OF THE DRAWINGS

FIG. 23 is a diagram illustrating a relationship between a pipeline stage output and a digital value for correction, for explaining the operation of the correction A/D converter as a component of the A/D converter according to the first embodiment.

FIG. 24 is a diagram illustrating a relationship between a pipeline stage output and a digital value for correction, for explaining the operation of the correction A/D converter as a component of the A/D converter according to the first embodiment.

DETAILED DESCRIPTION OF THE PREFERRED EMBODIMENTS

Hereinafter, specific embodiments of A/D converters according to the present invention will be described with reference to the drawings.

Embodiment 1

Figure 1:
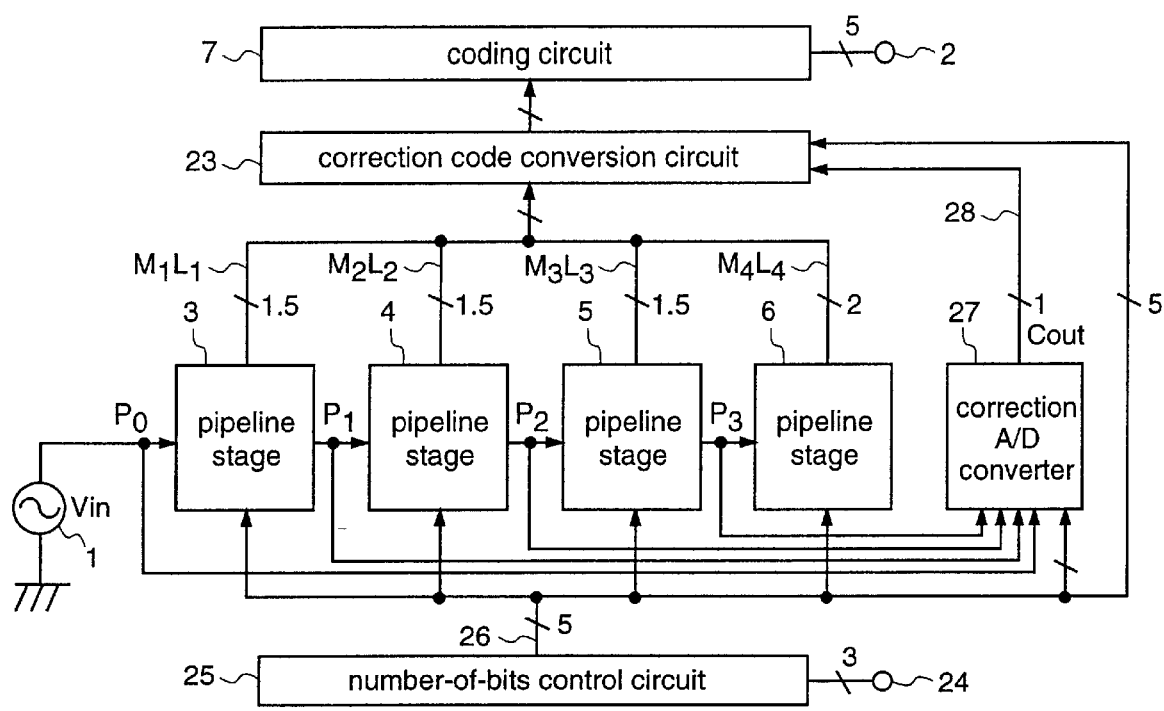
FIG. 1 is a block diagram illustrating the construction of a pipeline A/D converter according to a first embodiment of the invention.

FIG. 1 is a block diagram illustrating the construction of a pipeline A/D converter according to a first embodiment of the invention, which can vary resolution of a digital output signal over a range of 1–5 bits. The pipeline A/D converter according to the first embodiment is supplied with an analog input signal 1, and outputs a digital output signal 2. More specifically, the analog input signal 1 indicated by a partial analog voltage P0 is input to a first pipeline stage 3. An output of the first pipeline stage 3, which is indicated by a partial analog voltage value P1, is input to a second pipeline stage 4. An output of the second pipeline stage 4, which is indicated by a partial analog voltage value P2, is input to a third pipeline stage 5. An output of the third pipeline stage 5, which is indicated by a partial analog voltage value P3, is input to a fourth pipeline stage 6.

Partial digital values M1L1–M4L4 obtained in the respective pipeline stages are connected to a correction code conversion circuit 23, and an output of the correction code conversion circuit 23 is connected to a coding circuit 7. On the other hand, a number-of-bits control signal 24 is connected to a number-of-bits control circuit 25, and a number-of-bits selection signal 26 as an output of the number-of-bits control circuit 25 is connected to the first to fourth pipeline stages 3–6, a correction A/D converter 27, and the correction code conversion circuit 23. Further, the partial analog voltage values P0–P3 are connected to the correction A/D converter 27, and a partial digital value 28 for correction (hereinafter referred to as "correction partial digital value"), which is an output of the correction A/D converter 27 and is indicated by Cout, is connected to the correction code conversion circuit 23. The foregoing is the construction of the pipeline A/D converter according to the first embodiment.

Next, a description will be given of the operation of the pipeline A/D converter according to the first embodiment when it outputs a digital output signal having 5-bit resolution.

When the number-of-bits control signal 24 for outputting a digital output signal having 5-bit resolution is applied to the number-of-bits control circuit 25, the number-of-bits control circuit 25 outputs the number-of-bits selection signal 26 so as to operate the first to fourth pipeline stages 3–6, and halt the correction A/D converter 27.

It is assumed that the halted correction A/D converter 27 outputs either [0] or [1] as the correction partial digital value Cout. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23 and the second pipeline stage 4, respectively.

Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the correction code conversion circuit 23 and the third pipeline stage 5, respectively. Likewise, when the partial analog voltage value P2 is input to the third pipeline stage 5, the third pipeline stage 5 outputs the partial digital value M3L3 which is a binary code having 1.5 bits of information, and the partial analog voltage value P3, according to the partial analog voltage value P2. The partial digital value M3L3 and the partial analog voltage value P3 are input to the correction code conversion circuit 23 and the fourth pipeline stage 6, respectively. When the partial analog voltage value P3 is input to the fourth pipeline stage 6, the fourth pipeline stage 6 outputs the partial digital value M4L4 which is a binary code having 2 bits of information and constitutes a least significant bit of the digital output signal 2, according to the partial analog voltage value P3, and the partial digital value M4L4 is input to the correction code conversion circuit 23.

In order to output a digital output signal having 5-bit resolution, it is not necessary to correct the partial digital values M1L1–M4L4 outputted from the first to fourth pipeline stages 3–6. So, the partial digital values M1L1–M4L4 are input to the coding circuit 7 as they are, and the coding circuit 7 codes these values M1L1–M4L4 to output, as a result, the digital output signal 2 which is a binary code and has 5-bit resolution. In this way, the pipeline A/D converter outputs the digital output signal having 5-bit resolution.

Next, a description will be given of the operation of the pipeline A/D converter of the first embodiment when it outputs a digital output signal having 4-bit resolution. When the number-of-bits control signal 24 for outputting a digital output signal having 4-bit resolution is input to the number-of-bits control circuit 25, the number-of-bits control circuit 25 outputs the number-of-bits selection signal 26 so as to operate the first to third pipeline stages 3–5, halt the fourth pipeline stage 6, and operate the correction A/D converter 27.

It is assumed that the halted fourth pipeline stage 6 outputs [00] as the partial digital value M4M4. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23 and the second pipeline stage 4, respectively. Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the correction code conversion circuit 23 and the third pipeline stage 5, respectively. Likewise, when the partial analog voltage value P2 is input to the third pipeline stage 5, the third pipeline stage 5 outputs the partial digital value M3L3 which is a binary code having 1.5 bits of information, and the partial analog voltage value P3, according to the partial analog voltage value P2. The partial digital value M3L3 and the partial analog voltage value P3 are input to the correction code conversion circuit 23 and the correction A/D converter 27, respectively.

The correction A/D converter 27 selects the partial analog voltage value P3 from among the partial analog voltage values P0–P3 inputted to the correction A/D converter 27, according to the number-of-bits control signal 26, and outputs the correction partial digital value 28 which is a binary code having 1 bit of information and is indicated by Cout, according to the partial analog voltage value P3, by a method described later. The correction partial digital value 28 is input to the correction code conversion circuit 23.

In order to output a digital output signal having 4-bit resolution, the partial digital value M4 outputted from the fourth pipeline stage 6 is corrected using the correction partial digital value 28 and, thereafter, the partial digital values M1L1–M4L4 are input to the coding circuit 7, and coded in the coding circuit 7, thereby outputting the digital output signal 2 which is a binary code and has 4-bit resolution. In this way, the pipeline A/D converter outputs the digital output signal having 4-bit resolution.

Next, a description will be given of the operation of the pipeline A/D converter of the first embodiment when it outputs a digital output signal having 3-bit resolution. When the number-of-bits control signal 24 for outputting a digital output signal having 3-bit resolution is input to the number-of-bits control circuit 25, the number-of-bits control circuit 25 outputs the number-of-bits selection signal 26 so as to operate the first and second pipeline stages 3 and 4, halt the third and fourth pipeline stages 5 and 6, and operate the correction A/D converter 27.

It is assumed that the halted third and fourth pipeline stages 5 and 6 output [00] as the partial digital values M3M3 and M4M4. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23 and the second pipeline stage 4, respectively. Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and -the partial analog voltage value P2 are input to the correction code conversion circuit 23 and the correction A/D converter 27, respectively.

The correction A/D converter 27 selects the partial analog voltage value P2 from among the partial analog voltage values P0–P3 inputted to the correction A/D converter 27, according to the number-of-bits control signal 26, and outputs the correction partial digital value 28 which is a binary code having 1 bit of information and is indicated by Cout, according to the partial analog voltage value P2, by a method described later. The correction partial digital value 28 is input to the correction code conversion circuit 23. In order to output a digital output signal having 3-bit resolution, the partial digital value M3 outputted from the third pipeline stage 5 is corrected using the correction partial digital value 28 and, thereafter, the partial digital values M1L1–M4L4 are input to the coding circuit 7 and coded in the coding circuit 7, thereby outputting the digital output signal 2 which is a binary code and has 3-bit resolution.

In this way, the pipeline A/D converter outputs the digital output signal having 3-bit resolution.

Next, a description will be given of the operation of the pipeline A/D converter of the first embodiment when it outputs a digital output signal having 2-bit resolution. When the number-of-bits control signal 24 for outputting a digital output signal having 2-bit resolution is input to the number-of-bits control circuit 25, the number-of-bits control circuit 25 outputs the number-of-bits selection signal 26 so as to operate the first pipeline stage 3, halt the second to fourth pipeline stages 4–6, and operate the correction A/D converter 27.

It is assumed that the halted second to fourth pipeline stages 4–6 output [00] as the partial digital values M2M2 and M4M4. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23 and the correction A/D converter 27.

The correction A/D converter 27 selects the partial analog voltage value P1 from among the partial analog voltage values P0–P3 inputted to the correction A/D converter 27, according to the number-of-bits control signal 26, and outputs the correction partial digital value 28 which is a binary code having 1 bit of information and is indicated by Cout, according to the partial analog voltage value P1, by a method described later. The correction partial digital value 28 is input to the correction code conversion circuit 23. In order to output a digital output signal having 2-bit resolution, the partial digital value M2 outputted from the second pipeline stage 4 is corrected using the correction partial digital value 28 and, thereafter, the partial digital values M1L1–M4L4 are input to the coding circuit 7 and coded in the coding circuit 7, thereby outputting the digital output signal 2 which is a binary code and has 2-bit resolution. In this way, the pipeline A/D converter outputs the digital output signal having 2-bit resolution.

Next, a description will be given of the operation of the pipeline A/D converter of the first embodiment when it outputs a digital output signal having 1-bit resolution. When the number-of-bits control signal 24 for outputting a digital output signal having 1-bit resolution is input to the number-of-bits control circuit 25, the number-of-bits control circuit 25 outputs the number-of-bits selection signal 26 so as to halt the first to fourth pipeline stages 3–6, and operate the correction A/D converter 27.

It is assumed that the halted first to fourth pipeline stages 3–6 output [00] as the partial digital values M1M1–M4M4. The correction A/D converter 27 selects the partial analog voltage value P0 from among the partial analog voltage values P0–P3 inputted to the correction A/D converter 27, according to the number-of-bits control signal 26, and outputs the correction partial digital value 28 which is a binary code having 1 bit of information and is indicated by Cout, according to the partial analog voltage value P0, by a method described later. The correction partial digital value 28 is input to the correction code conversion circuit 23. In order to output a digital output signal having 1-bit resolution, the partial digital value M1 outputted from the first pipeline stage 3 is corrected using the correction partial digital value 28 and, thereafter, the partial digital values M1L1–M4L4 are input to the coding circuit 7 and coded in the coding circuit 7, thereby outputting the digital output signal 2 which is a binary code and has 1-bit resolution. In this way, the pipeline A/D converter outputs the digital output signal having 1-bit resolution.

Figure 2:
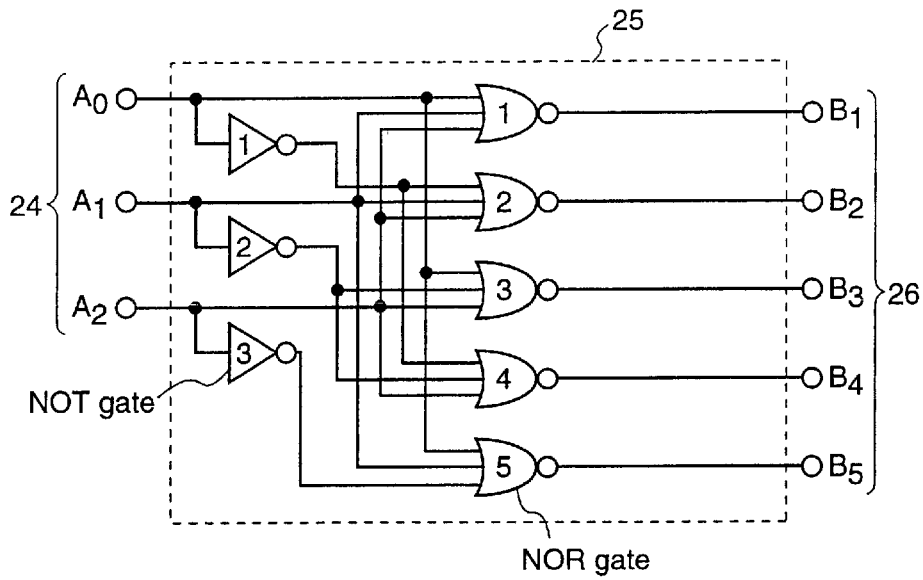
FIG. 2 is a block diagram illustrating a number-of-bits control circuit as a component of the pipeline A/D converter according to the first embodiment.

FIG. 2 is a block diagram illustrating the specific construction of the number-of-bits control circuit employed in the pipeline A/D converter according to the first embodiment. Among the number-of-bits control signals 24, a number-of-bits control signal A0 is connected to the first NOT gate and to the first input terminals of the first, third, and fifth NOR gates, a number-of-bits control signal A1 is connected to the second NOT gate and to the second input terminals of the first, second, and fifth NOR gates, and a number-of-bits control signal A2 is connected to the third NOT gate and to the third input terminals of the first, second, third, and fourth NOR gates. Further, an output of the first NOT gate is connected to the first input terminals of the second and fourth NOR gate, an output of the second NOT gate is connected to the second input terminals of the third and fourth NOR gates, and an output of the third NOT gate is connected to the third input terminal of the fifth NOR gate. Furthermore, an output of the first NOR gate is outputted as a bit selection signal 26 indicated by B1, an output of the second NOR gate is outputted as a bit selection signal 26 indicated by B2, an output of the third NOR gate is outputted as a bit selection signal 26 indicated by B3, an output of the fourth NOR gate is outputted as a bit selection signal 26 indicated by B4, and an output of the fifth NOR gate is outputted as a bit selection signal 26 indicated by B5.

Next, the operation of the number-of-bits control circuit 25 will be described. When [000] is input to the number-of-bits control signals A2–A0, only the output of the first NOR gate becomes 1 level while the outputs of the second to fifth NOR gates become 0 level, whereby the number-of-bits selection signals B5–B1 [00001] are outputted. When [001] is input to the number-of-bits control signals A2–A0, only the output of the second NOR gate becomes 1 level while the outputs of the first, third, fourth, and fifth NOR gates become 0 level, whereby the number-of-bits selection signals B5–B1 [00010] are outputted. When [010] is input to the number-of-bits control signals A2–A0, only the output of the third NOR gate becomes 1 level while the outputs of the first, second, fourth, and fifth NOR gates become 0 level, whereby the number-of-bits selection signals B5–B1 [00100] are outputted. When [011] is input to the number-of-bits control signals A2–A0, only the output of the fourth NOR gate becomes 1 level while the outputs of the first, second, third, and fifth NOR gates become 0 level, whereby the number-of-bits selection signals B5–B1 [01000] are outputted. When [100] is input to the number-of-bits control signals A2–A0, only the output of the fifth NOR gate becomes 1 level while the outputs of the first to fourth NOR gates become 0 level, whereby the number-of-bits selection signals B5–B1 [10000] are outputted.

When the number-of-bits selection signal B5 indicates 1 level while the other number-of-bits selection signals indicate 0 level, the pipeline A/D converter according to the first embodiment operates as an A/D converter having 5-bit resolution. Likewise, when the number-of-bits selection signal B4 indicates 1 level while the other number-of-bits selection signals indicate 0 level, the pipeline A/D converter operates as an A/D converter having 4-bit resolution. When the number-of-bits selection signal B3 indicates 1 level while the other number-of-bits selection signals indicate 0 level, the pipeline A/D converter operates as an A/D converter having 3-bit resolution. When the number-of-bits selection signal B2 indicates 1 level while the other number-of-bits selection signals indicate 0 level, the pipeline A/D converter operates as an A/D converter having 2-bit resolution. When the number-of-bits selection signal B1 indicates 1 level while the other number-of-bits selection signals indicate 0 level, the pipeline A/D converter operates as an A/D converter having 1-bit resolution. The foregoing is the operation of the number-of-bits control circuit 25 used in the pipeline A/D converter according to the first embodiment.

While the number-of-bits control circuit 25 shown in FIG. 2 is constituted by using the NOT gates and the NOR gates, it can be constituted by other logic circuits with the same effects as mentioned above.

Further, in the construction shown in FIG. 2, when the logical states of the number-of-bits control signals A2–A0 are [000], [001], [010], [011], and [100], the number-of-bits selection signals B5–B1 are outputted as [00001], [00010],

[00100], [01000], and [10000], respectively. However, the logical states of the number-of-bits control signals A2–A0 may be arbitrarily selected so long as the number-of-bits selection signals B5–B1 are uniquely determined with respect to the number-of-bits control signals A2–A0, and the circuits receiving the number-of-bits selection signals correspond to the logical states, so that the same effects as mentioned above can be obtained.

Furthermore, in the construction shown in FIG. 2, only one selection signal among the number-of-bits selection signals B5–B1 is output as 1 level while the remaining four selection signals are output as 0 level. However, the same effects as mentioned above can be achieved even when only one selection signal among the number-of-bits selection signals B5–B1 is output as 0 level while the remaining four selection signals are output as 1 level or when arbitrary logical states are outputted as the number-of-bits selection signals B5–B1, so long as the number-of-bits selection signals B5–B1 are uniquely determined with respect to the number-of-bits control signals A2–A0, and the circuits receiving the number-of-bits selection signals correspond to the logical states.

Figure 3:
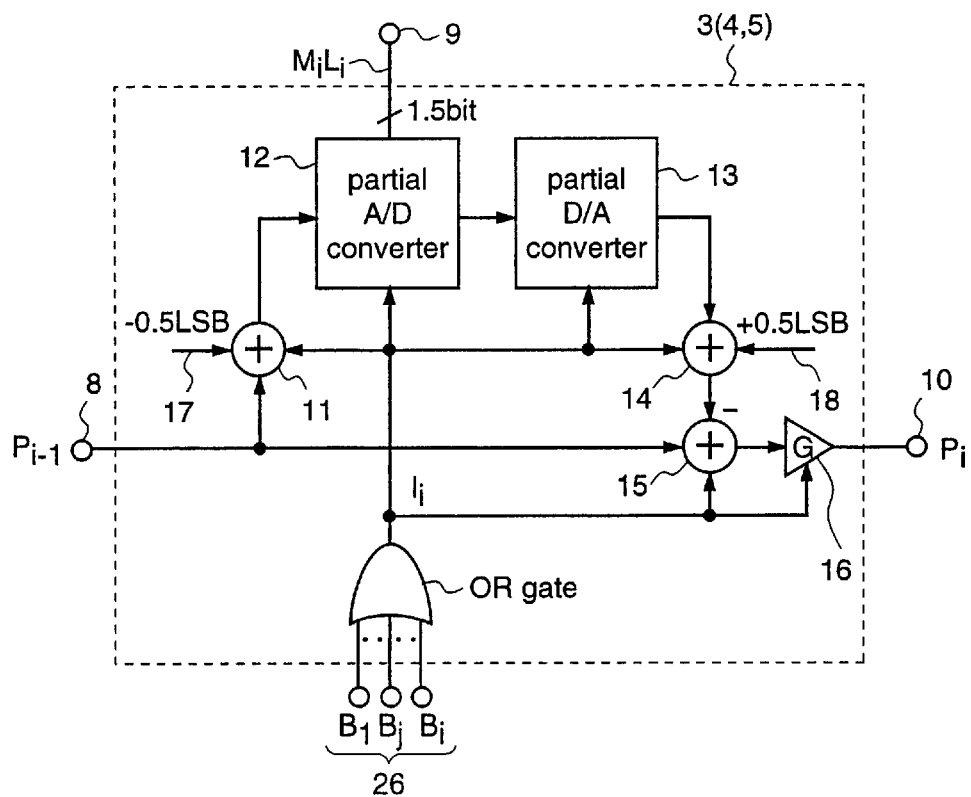
FIG. 3 is a block diagram illustrating each of first to third pipeline stages as components of the pipeline A/D converter according to the first embodiment.

Hereinafter, the constructions of the i-th (first to fourth) pipeline stages will be described in more detail. FIG. 3 is a block diagram illustrating the construction of each of the first to third pipeline stages 3–5 employed in the pipeline A/D converter according to the first embodiment. Each of the first to third pipeline stages 3–5 is supplied with, as an input, a first partial analog voltage value 8 indicated by Pi–1, and outputs a partial digital value 9 indicated by MiLi, and a second partial analog voltage value 10 indicated by Pi. Further, each of the first to third pipeline stages is supplied with, as inputs, the number-of-bits selection signals B1–Bi which are outputted from the number-of-bits control circuit 25 shown in FIG. 2, and it is determined whether each pipeline stage should carry out a series of pipeline operations or halt it, according to the number-of-bits selection signals B1–Bi.

The first partial analog voltage value 8 is input to a first offset addition unit 11. An output of the first offset addition unit 11 is input to a partial A/D converter 12. An output of the partial A/D converter 12 is input to a partial D/A converter 13. An output of the partial D/A converter 13 is input to a second offset addition unit 14. An output of the second offset addition unit 14 and the first partial analog voltage value 8 are input to a subtracter 15. An output of the subtracter 15 is input to an arithmetic amplifier 16. An output of the arithmetic amplifier 16 becomes the second partial analog voltage value 10.

Only the number-of-bits selection signal B1 is connected to an OR circuit 26 in the first pipeline stage 3, and the number-of-bits selection signals B1–B3 (i.e., the number-of-bits selection signals B1–Bi described above) are connected to an OR circuit 26 in the third pipeline stage 5. An output Ii of the OR circuit 26 is connected to the first offset addition unit 11, the partial A/D converter 12, the partial D/A converter 13, the second offset addition unit 14, the subtracter 15, and the arithmetic amplifier 16.

Figure 4:
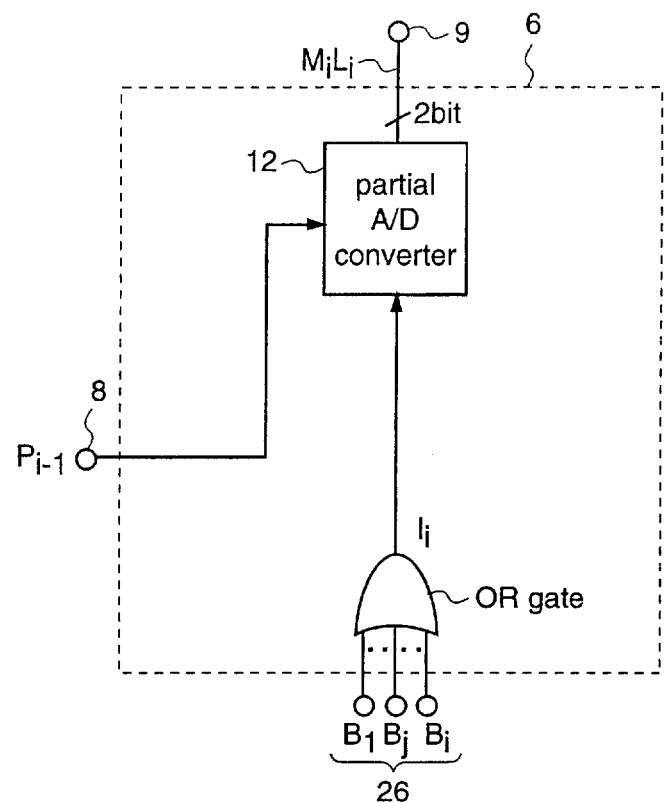
FIG. 4 is a block diagram illustrating a fourth pipeline stage as a component of the pipeline A/D converter according to the first embodiment.

On the other hand, FIG. 4 is a block diagram illustrating the fourth pipeline stage 6 which is the final stage. The fourth pipeline stage is supplied with, as an input, a first partial analog voltage value 8 indicated by Pi–1, and outputs a partial digital value 9 indicated by MiLi. The first partial analog voltage value 8 is input to a partial A/D converter 12. The number-of-bits selection signals B1–B4 are input to an OR circuit 26, and an output Ii of the OR circuit 26 is input to the partial A/D converter 12. The foregoing is the constructions of the respective pipeline stages used in the pipeline A/D converter according to the first embodiment.

Hereinafter, the operation of the i-th (first to fourth) pipeline stages will be described.

In each of the first to third pipeline stages 3–5, when all of the inputted number-of-bits selection signals B1–Bi are 0 level, i.e., when the pipeline A/D converter operates as an A/D converter having resolution equal to or higher than (i+1)-bit precision, the output Ii from the OR circuit 26 becomes 0 level. At this time, a series of pipeline operations in which all of the pipeline stages are operated is carried out as usual. The first offset addition unit 11 adds an offset voltage value equivalent to –0.5 LSB, as a first offset voltage value 17, to the Pi–1 which is the inputted partial analog voltage value 8, and the partial A/D converter 12 performs A/D conversion on the Pi–1 to output, as the partial digital value 9, [00,01,10] which are binary codes each corresponding to 1.5-bit output and having Mi as a higher-order bit and Li as a lower-order bit.

Furthermore, the partial D/A converter 13 performs D/A conversion on the partial digital value 9, and the second offset addition unit 14 adds, to a result of D/A conversion, an offset voltage value equivalent to +0.5 LSB as a second offset voltage value 18. Then, an output of the second offset addition unit 14 and the first partial analog voltage value 8 are input to the subtracter 15, and a difference voltage value between them is obtained. Thereafter, the arithmetic amplifier 16 amplifies the difference voltage value to output the Pi as the second partial analog voltage value 10.

On the other hand, when at least one of the inputted number-of-bits selection signals B1–Bi is 1 level, i.e., when the pipeline A/D converter operates as an A/D converter having resolution equal to or lower than i-bit precision, the output Ii from the OR circuit 26 becomes 1 level. At this time, the first offset addition unit 11, the partial A/D converter 12, the partial D/A converter 13, the second offset addition unit 14, the subtracter, and the arithmetic amplifier 16 halt their operations. The partial A/D converter 12 outputs [00] as the partial digital value 9 indicated by MiLi.

Further, in the fourth pipeline stage 6, when all of the inputted number-of-bits selection signals B1–B4 are 0 level, i.e., when the pipeline A/D converter operates as an A/D converter having resolution of 5-bit precision, the output Ii from the OR circuit 26 becomes 0 level. At this time, the fourth pipeline stage 6 performs a series of pipeline operations as usual. That is, the Pi–1, which is the inputted first partial analog voltage value 8, is A/D converted by the partial A/D converter 12, thereby outputting, as the partial digital value 9, [00,01,10,11] which are binary codes each corresponding to 2-bit output and having Mi as a higher-order bit and Li as a lower-order bit.

On the other hand, when at least one of the inputted number-of-bits selection signals B1–B4 is 1 level, i.e., when the pipeline A/D converter operates as an A/D converter having resolution equal to or lower than 4-bit precision, the output Ii from the OR circuit 26 becomes 1 level. At this time, the partial A/D converter 12 halts its operation. It is assumed that the partial A/D converter 12 outputs [00] as the partial digital value 9 indicated by MiLi. The foregoing is the operations of the pipeline stages used in the pipeline A/D converter according to the first embodiment.

Figure 5:
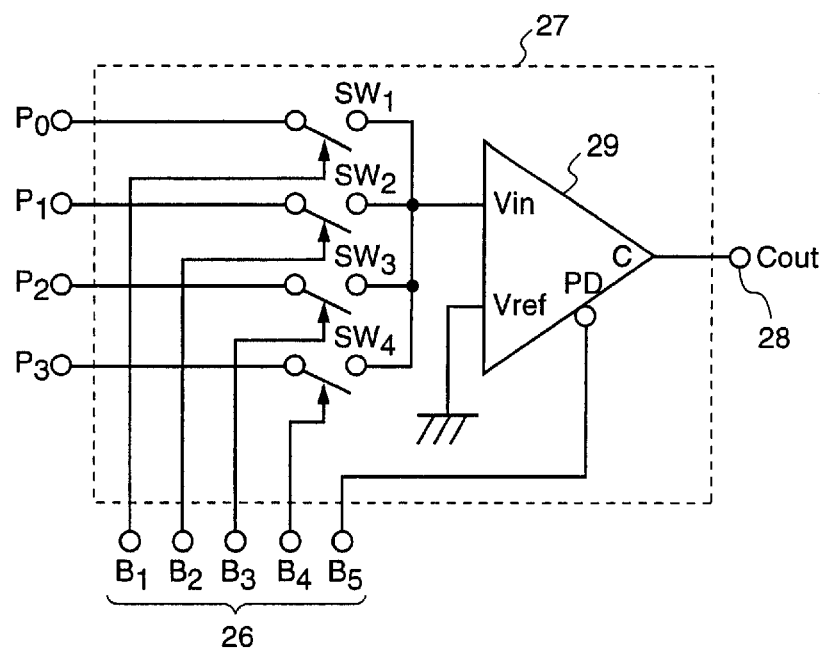
FIG. 5 is a block diagram illustrating a correction A/D converter as a component of the pipeline A/D converter according to the first embodiment.

FIG. 5 is a block diagram illustrating the specific construction of the correction A/D converter 27 employed in the pipeline A/D converter according to the first embodiment. The correction A/D converter 27 is supplies with, as inputs, the partial analog voltage values P0–P3 of the respective pipeline stages, selects one of the partial analog voltage values P0–P3 according to the number-of-bits selection signals B5–B1, performs voltage comparison, and outputs the correction partial digital value 28.

To be specific, the partial analog voltage values P0–P3 of the respective pipeline stages, which are supplied as inputs, are connected through switches SW1–SW4 to a Vin terminal as an input voltage terminal of a voltage comparator 29, respectively. A Vref terminal as a reference voltage terminal of the voltage comparator 29 is connected to GND level. Further, a C terminal output which indicates a result of voltage comparison performed by the voltage comparator 29 is outputted as the correction partial digital value 28 that is indicated by Cout.

Among the number-of-bits selection signals 26, B1–B4 are connected to the switches SW1–SW4, respectively, to determine the ON/OFF states of the switches SW1–SW4, while B5 is connected to a PD terminal that is a power-off terminal of the voltage comparator 29. The foregoing is the construction of the correction A/D converter 27 employed in the pipeline A/D converter of the first embodiment.

Hereinafter, the operation of the correction A/D converter 27 will be described in detail with reference to FIG. 23. Among the number-of-bits selection signals B1–B5 inputted to the correction A/D converter 27, one is 1 level while the others are 0 level. When the number-of-bits selection signal B5 is 1 level while the other number-of-bits selection signals B1–B4 are 0 level, i.e., when the pipeline A/D converter operates as an A/D converter having resolution of 5-bit precision (refer to FIG. 23(a)), the voltage comparator 29 is halted. At this time, the voltage comparator 29 outputs either 0 level or 1 level as the correction partial digital value Cout.

When the number-of-bits selection signal B4 is 1 level while the other number-of-bits selection signals are 0 level, i.e., when the pipeline A/D converter operates as an A/D converter having resolution of 4-bit precision (refer to FIG. 23(b)), the switch SW4 is ON and the other switches are OFF. Then, the voltage comparator 29 compared the partial analog voltage value P3 that is applied to the Vin terminal through the switch SW4, with the GND level connected to the Vref terminal, and outputs a binary code corresponding to 1-bit output as the correction partial digital value Cout. Likewise, when the number-of-bits selection signal B3 is 1 level while the other number-of-bits selection signals are 0 level, i.e., when the pipeline A/D converter operates as an A/D converter having resolution of 3-bit precision (refer to FIG. 23(c)), the switch SW3 is ON and the other switches are OFF. Then, the voltage comparator 29 compares the partial analog voltage value P2 that is applied to the Vin terminal through the switch SW3, with the GND level connected to the Vref terminal, and outputs a binary code corresponding to 1-bit output as the correction partial digital value Cout. When the number-of-bits selection signal B2 is 1 level while the other number-of-bits selection signals are 0 level, i.e., when the pipeline A/D converter operates as an A/D converter having resolution of 2-bit precision (refer to FIG. 23(d)), the switch SW2 is ON and the other switches are OFF. Then, the voltage comparator 29 compares the partial analog voltage value P1 that is applied to the Vin terminal through the switch SW2, with the GND level connected to the Vref terminal, and outputs a binary code corresponding to 1-bit output as the correction partial digital value Cout. When the number-of-bits selection signal B1 is 1 level and the other number-of-bits selection signals are 0 level, i.e., when the pipeline A/D converter operates as an A/D converter having resolution of 1-bit precision (refer to FIG. 23(e)), the switch SW1 is ON and the other switches are OFF. Then, the voltage comparator 29 compares the partial analog voltage value P0 that is applied to the Vin terminal through the switch SW1, with the GND level connected to the Vref terminal, and outputs a binary code corresponding to 1-bit output as the correction partial digital value Cout.

The foregoing is the operation of the correction A/D converter 27 employed in the pipeline A/D converter according to the first embodiment.

While in this first embodiment the partial analog voltage values P0–P3 are selected using the switches as shown in FIG. 5, other circuits may be employed so long as the circuits can select voltage values.

Further, while in this first embodiment the voltage comparator 29 shown in FIG. 5 compares the partial analog voltage values P0–P3 with the GND level, since a reference level of the partial analog voltage values P0–P3 can be arbitrarily set, these values P0–P3 may be compared with the reference level.

Figure 6:
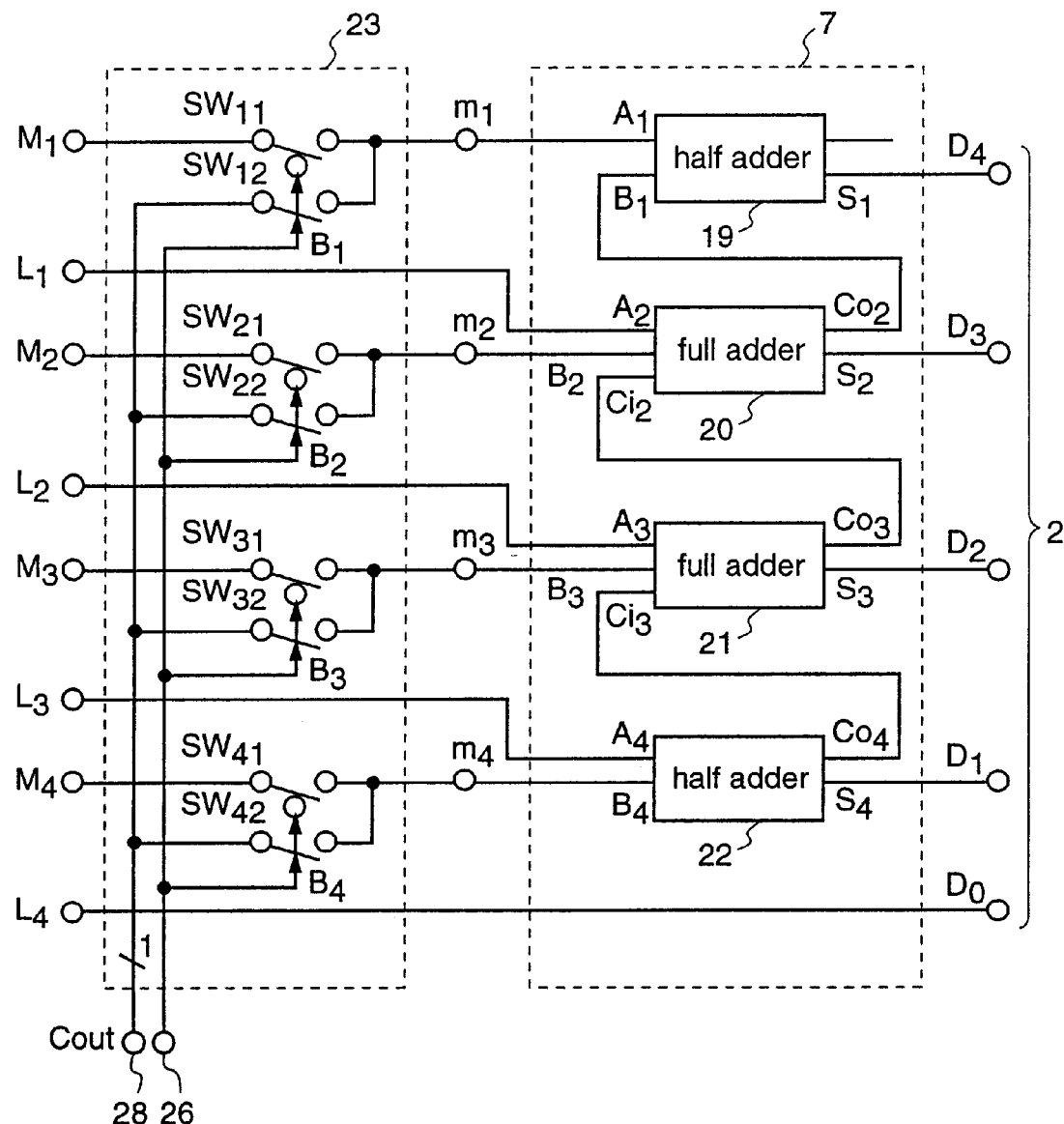
FIG. 6 is a block diagram illustrating a correction code conversion circuit as a component of the pipeline A/D converter according to the first embodiment.

FIG. 6 is a block diagram illustrating the specific constructions of the correction code conversion circuit 23 and the coding circuit 7 which are employed in the pipeline A/D converter according to the first embodiment. The correction code conversion circuit 23 is supplied with the partial digital values M1L1–M4L4 outputted from the first to fourth pipeline stages 3–6, the correction partial digital value Cout outputted from the correction A/D converter 27, and the number-of-bits selection signals B1–B4 (26), and outputs partial digital values m1–m4 which are obtained by correcting the higher-order bits M1–M4 of the partial digital values, using the correction partial digital value Cout, according to the number-of-bits selection signals B1–B4. In FIG. 6, an end of each of switches SW11–SW41 is connected to an end of each of switches SW12–SW42, and the connected ends of the switches are outputted as the partial digital values m1–m4 to be connected to the coding circuit 7.

The partial digital values M1–M4 are connected to ends of the switches SW11–SW41, which are not connected to the switches SW12–SW42. On the other hand, the partial digital values L1–L4 bypass the correction code conversion circuit 23, and are directly connected to the coding circuit 4. The correction partial digital value Cout is connected to the ends of the switches SW12–SW42, which are not connected to the switches SW11–SW41. The number-of-bits selection signals B1–B4 (26) are connected to the switches SW11–SW41 and to the switches SW12–SW42, respectively, to determine the ON/OFF states of the respective switches.

Next, the operation of the correction code conversion circuit 23 will be described. As for the number-of-bits selection signals B1–B4 (26) to be input to the correction code conversion circuit 23, all of these signals are 0 level, or one of these signals is 1 level while the others are 0 level. When all of the number-of-bits selection signals B1–B4 are 0 level, i.e., when the pipeline A/D converter operates as an A/D converter having resolution of 5-bit precision, the switches SW11–SW41 are ON and the switches SW12–SW42 are OFF, and the partial digital values M1–M4 are output through the switches SW11–SW41, respectively, to be input to the coding circuit 7 without being corrected.

When the number-of-bit selection signal B4 is 1 level while the other number-of-bit selection signals are 0 level, i.e., when the pipeline A/D converter operates as an A/D converter having resolution of 4-bit precision, the switches SW11–SW31 and SW42 are ON and the switches SW12–SW32 and SW41 are OFF. Then, the partial digital values M1–M3 and the correction partial digital value Cout are output through the switches SW11–SW31 and SW42, respectively, and the partial digital value M4 is corrected, and these partial digital values are input to the coding circuit 7.

Likewise, when the number-of-bit selection signal B3 is 1 level while the other number-of-bit selection signals are 0 level, i.e., when the pipeline A/D converter operates as an A/D converter having resolution of 3-bit precision, the switches SW11, SW21, SW32, and SW41 are ON while the switches SW12, SW22, SW31, and SW42 are OFF. Then, the partial digital values M1 and M2, the correction partial digital value Cout, and the partial digital value M4 are output through the switches SW11, SW21, SW32, and SW41, respectively, and the partial digital value M3 is corrected, and these partial digital values are input to the coding circuit 7.

Likewise, when the number-of-bit selection signal B2 is 1 level while the other number-of-bit selection signals are 0 level, i.e., when the pipeline A/D converter operates as an A/D converter having resolution of 2-bit precision, the switches SW11, SW22, SW31, and SW41 are ON while the switches SW12, SW21, SW32, and SW42 are OFF. Then, the partial digital value M1, the correction partial digital value Cout, and the partial digital values M3 and M4 are output through the switches SW11, SW22, SW31, and SW41, respectively, and the partial digital value M2 is corrected, and these partial digital values are input to the coding circuit 7.

Likewise, when the number-of-bit selection signal B1 is 1 level while the other number-of-bit selection signals are 0 level, i.e., when the pipeline A/D converter operates as an A/D converter having resolution of 1-bit precision, the switches SW12 and SW21–SW41 are ON while the switches SW11 and SW22–SW42 are OFF. Then, the correction partial digital value Cout and the partial digital values M2–M4 are output through the switches SW12 and SW21–SW41, respectively, and the partial digital value M1 is corrected, and these partial digital values are input to the coding circuit 7.

On the other hand, the partial digital values L1–L4 are input to the coding circuit 7 as they are, regardless of the number-of-bits selection signals B1–B4 (26).

While in this first embodiment the correction code conversion circuit 23 selects the partial digital values M1–M4 using the switches as shown in FIG. 6, it may be constituted by other circuits than the switches so long as the circuits can select the digital values.

As described above, according to the pipeline A/D converter of the first embodiment, when resolution of a digital output signal requested by the system varies over a range of 1–5 bits, a series of pipeline operations performed at the pipeline stages whose operations are not needed can be halted, whereby power consumption of the pipeline A/D converter is reduced. Simultaneously, even when the pipeline operations of the pipeline stages which output the partial digital values that are not required for constituting the digital value to be output, are halted, a compensation bit Cout for determining a least significant bit is generated by the correction A/D converter 27, and this compensation bit Cout is added to desired bits by the correction code conversion circuit 23, whereby resolution of the digital value to be output is compensated.

While in this first embodiment a pipeline A/D converter which can vary resolution of a digital output signal over a range of 1–5 bits is described, the number of bits of the digital output signal can be arbitrarily set.

Further, while in this first embodiment a A/D converter in which a partial digital value to be output from each pipeline stage is 1.5 bits or 2 bits is described, the number of bits of the partial digital value to be output from each pipeline stage may be arbitrarily set.

Furthermore, while in this first embodiment a A/D converter in which resolution of a correction A/D converter is 1 bit is described, the number of bits of a partial digital value for correction to be output from the correction A/D converter can be arbitrarily set.

Embodiment 2

Figure 7:
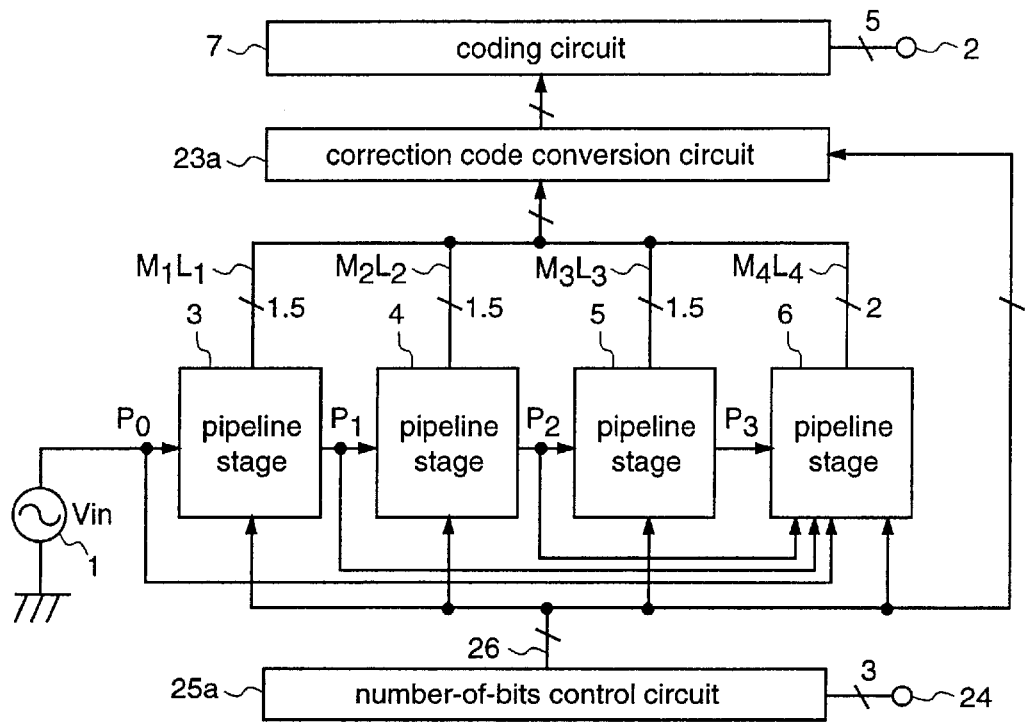
FIG. 7 is a block diagram illustrating the construction of a pipeline A/D converter according to a second embodiment of the invention.

FIG. 7 is a block diagram illustrating the construction of a pipeline A/D converter according to a second embodiment of the present invention, wherein the same reference numerals as those shown in FIG. 1 denote the same or corresponding parts. More specifically, FIG. 7 shows the construction of a pipeline A/D converter capable of varying resolution of a digital output signal over a range of 2–5 bits.

The pipeline A/D converter according to the second embodiment is supplied with an analog input signal 1, and outputs a digital output signal 2. To be specific, the analog input signal 1 indicated by a partial analog voltage P0 is input to a first pipeline stage 3. An output of the first pipeline stage 3, which is indicated by a partial analog voltage value P1, is input to a second pipeline stage 4. An output of the second pipeline stage 4, which is indicated by a partial analog voltage value P2, is input to a third pipeline stage 5. An output of the third pipeline stage 5, which is indicated by a partial analog voltage value P3, is input to a fourth pipeline stage 6.

Partial digital values M1L1–M4L4 obtained in the respective pipeline stages are connected to a correction code conversion circuit 23a, and an output of the correction code conversion circuit 23a is connected to a coding circuit 7. On the other hand, a number-of-bits control signal 24 is connected to a number-of-bits control circuit 25a, and a number-of-bits selection signal 26 as an output of the number-of-bits control circuit 25a is connected to the first to fourth pipeline stages 3–6 and to the correction code conversion circuit 23a. Further, the partial analog voltage values P0–P2 are connected to the fourth pipeline stage 6.

Next, the operation of the pipeline A/D converter will be described with reference to FIG. 24. Initially, a description will be given of a case where the pipeline A/D converter outputs a digital output signal having 5-bit resolution. When the number-of-bits control signal 24 for outputting a digital output signal having 5-bit resolution is applied to the number-of-bits control circuit 25a, the number-of-bits control circuit 25a outputs the number-of-bits selection signal 26 so as to operate the first to fourth pipeline stages 3–6. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23a and the second pipeline stage 4, respectively.

Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the correction code conversion circuit 23a and the third pipeline stage 5, respectively. Likewise, when the partial analog voltage value P2 is input to the third pipeline stage 5, the third pipeline stage 5 outputs the partial digital value M3L3 which is a binary code having 1.5 bits of information, and the partial analog voltage value P3, according to the partial analog voltage value P2. The partial digital value M3L3 and the partial analog voltage value P3 are input to the correction code conversion circuit 23a and the fourth pipeline stage 6, respectively. When the partial analog voltage value P3 is input to the fourth pipeline stage 6, the fourth pipeline stage 6 outputs the partial digital value M4L4 which is a binary code having 2 bits of information and constitutes a least significant bit of the digital output signal 2, according to the partial analog voltage value P3, and the partial digital value M4L4 is input to the correction code conversion circuit 23a.

In order to output a digital output signal having 5-bit resolution, it is not necessary to correct the partial digital values M1L1–M4L4 outputted from the first to fourth pipeline stages 3–6. So, the partial digital values M1L1–M4L4 are input to the coding circuit 7 as they are, and coded in the coding circuit 7, thereby outputting the digital output signal 2 which is a binary code and has 5-bit resolution (refer to FIG. 24(a)). In this way, the pipeline A/D converter outputs the digital output signal having 5-bit resolution.

Next, a description will be given of the operation of the pipeline A/D converter when it outputs a digital output signal having 4-bit resolution. When the number-of-bits control signal 24 for outputting a digital output signal having 4-bit resolution is input to the number-of-bits control circuit 25a, the number-of-bits control circuit 25a outputs the number-of-bits selection signal 26 so as to operate the first, second, and fourth pipeline stages 3, 4, and 6, and halt the third pipeline stage 5. It is assumed that the halted third pipeline stage 5 outputs [00] as the partial digital value M3L3. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23a and the second pipeline stage 4, respectively.

Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the correction code conversion circuit 23a and the fourth pipeline stage 6, respectively. When the partial analog voltage value P2 is input to the fourth pipeline stage 6, the fourth pipeline stage 6 outputs the partial digital value M4L4 which is a binary code having 2 bits of information, according to the partial analog voltage value P2, and the partial digital value M4L4 is input to the correction code conversion circuit 23a.

In order to output a digital output signal having 4-bit resolution, the partial digital value M3L3 outputted from the third pipeline stage 5 is corrected using the partial digital value M4L4, and the partial digital value M4L4 is corrected to [00], and thereafter, the partial digital values M1L1–M4L4 are input to the coding circuit 7, and coded in the coding circuit 7, thereby outputting the digital output signal 2 which is a binary code and has 4-bit resolution (refer to FIG. 24(b)). In this way, the pipeline A/D converter outputs the digital output signal having 4-bit resolution.

Next, a description will be given of the operation of the pipeline A/D converter when it outputs a digital output signal having 3-bit resolution. When the number-of-bits control signal 24 for outputting a digital output signal having 3-bit resolution is input to the number-of-bits control circuit 25a, the number-of-bits control circuit 25a outputs the number-of-bits selection signal 26 so as to operate the first and fourth pipeline stages 3 and 6, and halt the second and third pipeline stages 4 and 5. It is assumed that the halted second and third pipeline stages 4 and 5 output [00] as the partial digital values M2L2 and M3L3, respectively. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the correction code conversion circuit 23a and the fourth pipeline stage 6, respectively. When the partial analog voltage value P1 is input to the fourth pipeline stage 6, the fourth pipeline stage 6 outputs the partial digital value M4L4 which is a binary code having 2 bits of information, according to the partial analog voltage value P1, and the partial digital value M4L4 is input to the correction code conversion circuit 23a. In order to output a digital output signal having 3-bit resolution, the partial digital value M2L2 outputted from the second pipeline stage 4 is corrected using the partial digital value M4L4, and the partial digital value M4L4 is corrected to [00], and thereafter, the partial digital values M1L1–M4L4 are input to the coding circuit 7, and coded in the coding circuit 7, thereby outputting the digital output signal 2 which is a binary code and has 3-bit resolution (refer to FIG. 24(c)). In this way, the pipeline A/D converter outputs the digital output signal having 3-bit resolution.

Next, a description will be given of the operation of the pipeline A/D converter when it outputs a digital output signal having 2-bit resolution. When the number-of-bits control signal 24 for outputting a digital output signal having 2-bit resolution is input to the number-of-bits control circuit 25a, the number-of-bits control circuit 25a outputs the number-of-bits selection signal 26 so as to operate the fourth pipeline stage 6, and halt the first to third pipeline stages 3–5. It is assumed that the halted first to third pipeline stages 3–5 output [00] as the partial digital values M1L1–M3L3, respectively. At this time, the analog input signal 1 indicated by the partial analog voltage value P0 is input to the fourth pipeline stage 6. When the partial analog voltage value P0 is input to the fourth pipeline stage 6, the fourth pipeline stage 6 outputs the partial digital value M4L4 which is a binary code having 2 bits of information, according to the analog input signal 1, and the partial digital value M4L4 is input to the correction code conversion circuit 23a. In order to output a digital output signal having 2-bit resolution, the partial digital value M1L1 outputted from the first pipeline stage 3 is corrected using the partial digital value M4L4, and the partial digital value M4L4 is corrected to [00], and thereafter, the partial digital values M1L1–M4L4 are input to the coding circuit 7, and coded in the coding circuit 7 codes, thereby outputting the digital output signal 2 which is a binary code and has 2-bit resolution (refer to FIG. 24(d)). In this way, the pipeline A/D converter outputs the digital output signal having 2-bit resolution.

Figure 8:
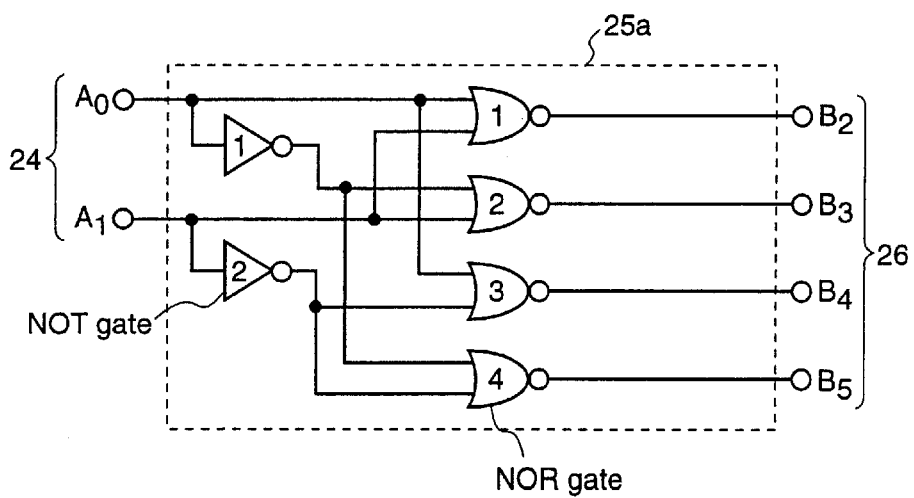
FIG. 8 is a block diagram illustrating a number-of-bits control circuit as a component of the pipeline A/D converter according to the second embodiment.

FIG. 8 is a block diagram illustrating the specific construction of the number-of-bits control circuit 25a employed in the pipeline A/D converter according to the second embodiment. the number-of-bits control signal A0 is connected to the first NOT gate and to the first input terminals of the first and third NOR gates, and the number-of-bits control signal A1 is connected to the second NOT gate and to the second input terminals of the first and second NOR gates. An output of the first NOT gate is connected to the first input terminals of the second and fourth NOR gates, and an output of the second NOT gate is connected to the second input terminals of the third and fourth NOR gates. An output of the first NOR gate is outputted as a bit selection signal 26 indicated by B3, an output of the third NOR gate is outputted as a bit selection signal 26 indicated by B3, an output of the third NOR gate is outputted as a bit selection signal 26 indicated by B4, and an output of the fourth NOR gate is outputted as a bit selection signal 26 indicated by B5. The foregoing is the construction of the number-of-bits control circuit used in the pipeline A/D converter of the second embodiment.

Next, the operation of the number-of-bits control circuit 25a will be described in detail. When [00] is input to the number-of-bits control signals A1–A0, only the output of the first NOR gate becomes 1 level while the outputs of the second to fourth NOR gates become 0 level, whereby the number-of-bits selection signals B5–B2 [0001] are outputted. When [01] is input to the number-of-bits control signals A1–A0, only the output of the second NOR gate becomes 1 level while the outputs of the first, third, and fourth NOR gates become 0 level, whereby the number-of-bits selection signals B5–B2 [0010] are outputted. When [10] is input to the number-of-bits control signals A1–A0, only the output of the third NOR gate becomes 1 level while the outputs of the first, second, and fourth NOR gates become 0 level, whereby the number-of-bits selection signals B5–B2 [0100] are outputted. When [11] is input to the number-of-bits control signals A1–A0, only the output of the fourth NOR gate becomes 1 level while the outputs of the first to third NOR gates become 0 level, whereby the number-of-bits selection signals B5–B2 [1000] are outputted.

When the number-of-bits selection signal B5 indicates 1 level while the other number-of-bits selection signals indicate 0 level, the pipeline A/D converter according to the second embodiment operates as an A/D converter having 5-bit resolution. Likewise, when the number-of-bits selection signal B4 indicates 1 level while the other number-of-bits selection signals indicate 0 level, the pipeline A/D converter operates as an A/D converter having 4-bit resolution. When the number-of-bits selection signal B3 indicates 1 level while the other number-of-bits selection signals indicate 0 level, the pipeline A/D converter operates as an A/D converter having 3-bit resolution. When the number-of-bits selection signal B2 indicates 1 level while the other number-of-bits selection signals indicate 0 level, the pipeline A/D converter operates as an A/D converter having 2-bit resolution.

While the number-of-bits control circuit 25a shown in FIG. 8 is constituted using the NOT gates and the NOR gates, it may be constituted by other logic circuits with the same effects as mentioned above.

Further, in FIG. 8, when the logical states of the number-of-bits control signals A1–A0 are [00], [01], [10], and [11], the number-of-bits selection signals B5–B2 are outputted as [0001], [0010], [0100], and [1000], respectively. However, the logical states of the number-of-bits control signals A1–A0 may be arbitrarily selected so long as the number-of-bits selection signals B5–B2 are uniquely determined according to the number-of-bits control signals A1–A0, and the circuits receiving the number-of-bits selection signals B5–B2 correspond to the logical states, so that the same effects as mentioned above are obtained.

Furthermore, in FIG. 8, only one selection signal among the number-of-bits selection signals B5–B2 is outputted as 1 level while the remaining three selection signals are outputted as 0 level. However, the same effects as mentioned above can be obtained even when only one selection signal among the number-of-bits selection signals B5–B2 is outputted as 0 level while the remaining three selection signals are outputted as 1 level, or when arbitrary logical states are outputted as the number-of-bits selection signals B5–B2, so long as the number-of-bits selection signals B5–B2 are uniquely determined according to the number-of-bits control signals A1–A0, and the circuits receiving the number-of-bits selection signals correspond to the logical states.

Figure 9:
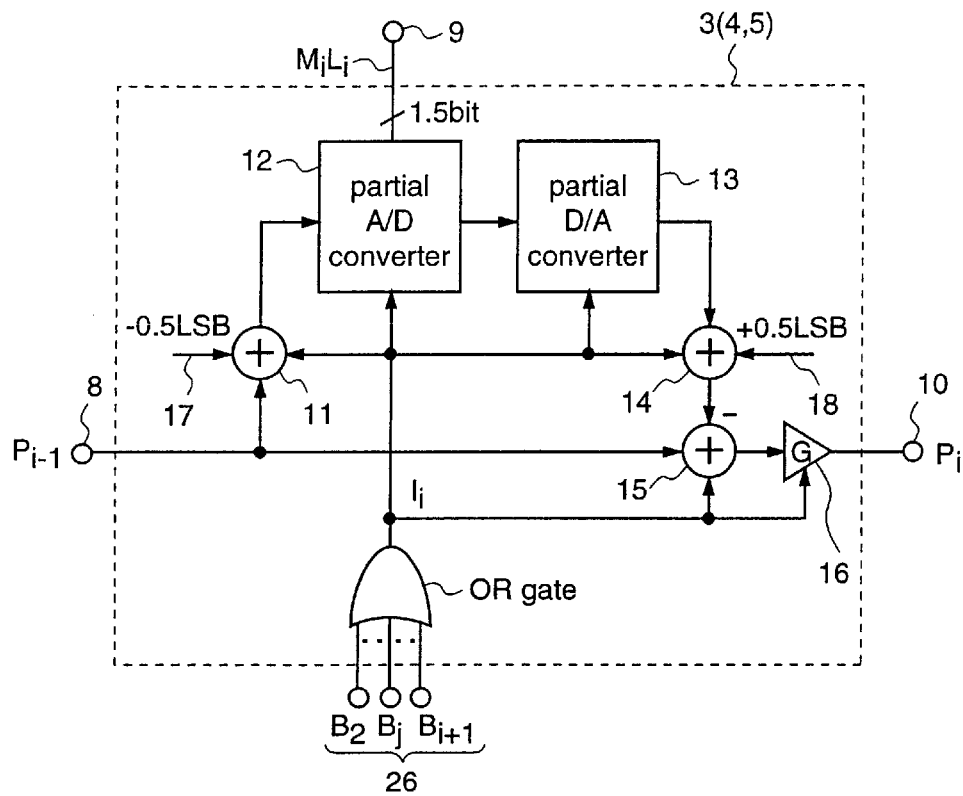
FIG. 9 is a block diagram illustrating each of first to third pipeline stages as components of the pipeline A/D converter according to the second embodiment.

Hereinafter, the constructions of the i-th (first to fourth) pipeline stages will be described in more detail. FIG. 9 is a block diagram illustrating the construction of each of the first to third pipeline stages 3–5 employed in the pipeline A/D converter according to the second embodiment. Each of the first to third pipeline stages 3–5 is supplied with, as an input, a first partial analog voltage value 8 indicated by Pi−1, and outputs a partial digital value 9 indicated by MiLi, and a second partial analog voltage value 10 indicated by Pi. Further, each of the first to third pipeline stages is supplied with, as inputs, the number-of-bits selection signals B2–Bi+1, and it is determined whether each pipeline stage should perform a series of pipeline operations or halt it, according to the number-of-bits selection signals.

The first partial analog voltage value 8 is input to a first offset addition unit 11. An output of the first offset addition unit 11 is input to a partial A/D converter 12. An output of the partial A/D converter 12 is input to a partial D/A converter 13. An output of the partial D/A converter 13 is input to a second offset addition unit 14. An output of the second offset addition unit 14 and the first partial analog voltage value 8 are input to a subtracter 15. An output of the subtracter 15 is input to an arithmetic amplifier 16. An output of the arithmetic amplifier 16 becomes the second partial analog voltage value 10.

Only the number-of-bits selection signal B2 is connected to an OR circuit in the first pipeline stage 3, and the number-of-bits selection signals B2–B4 (i.e., the number-of-bits selection signals B2–Bi+1) are connected to an OR circuit in the third pipeline stage 5, and an output Ii of the OR circuit is connected to the first offset addition unit 11, the partial A/D converter 12, the partial D/A converter 13, the second offset addition unit 14, the subtracter 15, and the arithmetic amplifier 16.

Figure 10:
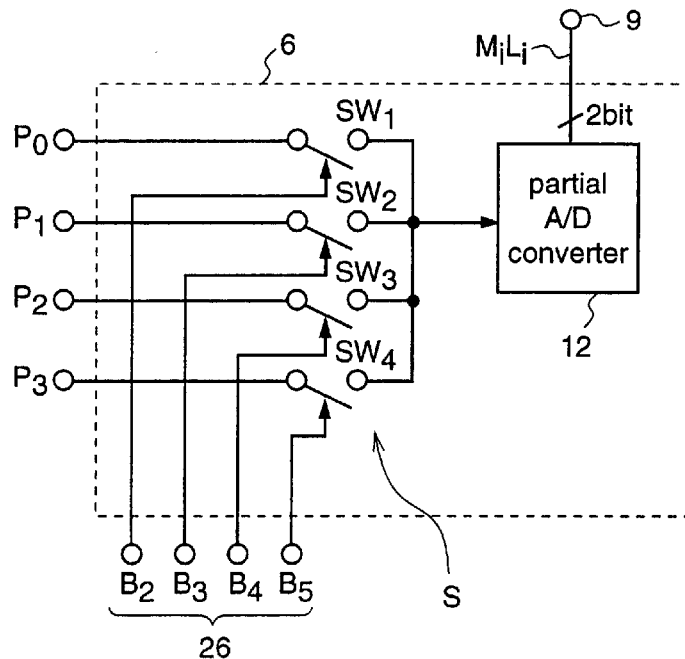
FIG. 10 is a block diagram illustrating a fourth pipeline stage as a component of the pipeline A/D converter according to the second embodiment.

FIG. 10 is a block diagram illustrating the fourth pipeline stage 6 which is used in the pipeline A/D converter. The fourth pipeline stage is supplied with, as inputs, the partial analog voltage values P0–P3 of the respective pipeline stages, selects one of the partial analog voltage values P0–P3 according to the number-of-bits selection signals B2–B5, and outputs the partial digital value 9 indicated as MiLi. The inputted partial analog voltage values P0–P3 of the respective pipeline stages are connected through switches SW1–SW4 to the partial A/D converter 12, and the partial digital value 9 indicated as MiLi is outputted. The number-of-bits selection signals B2–B5 are connected to the switches SW1–SW4, respectively, and determine the ON/OFF states of the respective switches. In this way, a selection means S, which selects an analog voltage value to be processed in the fourth pipeline stage 6 according to the number-of-bits selection signals, is constituted.

Hereinafter, the operations of the i-th (first to fourth) pipeline stages will be described in detail. In each of the first to third pipeline stages 3–5, when all of the inputted numberof-bits selection signals B2–Bi+1 are 0 level, i.e., when the pipeline A/D converter operates as an A/D converter having resolution equal to or higher than (i+2)-bit precision, the output Ii from the OR circuit (26) becomes 0 level. At this time, a series of pipeline operations is carried out as usual. The first offset addition unit 11 adds an offset voltage value equivalent to −0.5 LSB, as a first offset voltage value 17, to the Pi−1 which is the inputted partial analog voltage value 8, and the partial A/D converter 12 performs A/D conversion on the Pi−1, thereby outputting, as the partial digital value 9, [00,01,10] which are binary codes each corresponding to 1.5-bit output and having Mi as a higher-order bit and Li as lower-order bit. Furthermore, the partial D/A converter 13 performs D/A conversion on the partial digital value 9, and the second offset addition unit 14 adds an offset voltage value equivalent to +0.5 LSB, as a second offset voltage value 18, to a result of D/A conversion. Then, an output of the second offset addition unit 14 and the first partial analog voltage value 8 are input to the subtracter 15, and a difference voltage value between them is obtained. Thereafter, the arithmetic amplifier amplifies the difference voltage value to obtain the Pi as the second partial analog voltage value 10.

When at least one of the inputted number-of-bits selection signals B2–Bi+1 is 1 level, i.e., when the pipeline A/D converter serves as an A/D converter having resolution equal to or lower than (i+1)-bit precision, the output Ii from the OR circuit (26) becomes 1 level. At this time, the first offset addition unit 11, the partial A/D converter 12, the partial D/A converter 13, the second offset addition unit 14, the subtracter 15, and the arithmetic amplifier 16 halt their operations. The partial A/D converter 12 outputs [00] as the partial digital value 9 indicated by MiLi.

Further, in the fourth pipeline stage 6, when the number-of-bit selection signal B5 is 1 level and the other number-of-bits selection signals are 0 level, i.e., when the pipeline A/D converter serves as an A/D converter having resolution of 5-bit precision, the switch SW4 is ON and the other switches are OFF, and the partial A/D converter 12 performs A/D conversion on the partial analog voltage value P3 that is connected through the switch SW4, thereby outputting, as the partial digital value 9, [00,01,10,11] which are binary codes each corresponding to 2-bit output and having Mi as a higher-order bit and Li as a lower-order bit.

Further, when the number-of-bits selection signal B4 is 1 level while the other number-of-bits selection signals are 0 level, i.e., when the pipeline A/D converter operates as an A/D converter having resolution of 4-bit precision, the switch SW3 is ON and the other switches are OFF, and the partial A/D converter 12 performs A/D conversion on the partial analog voltage value P2 connected through the switch SW3, thereby outputting, as the partial digital value 9, [00,01,10,11] which are binary codes each corresponding to 2-bit output and having Mi as a higher-order bit and Li as a lower-order bit.

Further, when the number-of-bits selection signal B3 is 1 level while the other number-of-bits selection signals are 0 level, i.e., when the pipeline A/D converter operates as an A/D converter having resolution of 3-bit precision, the switch SW2 is ON and the other switches are OFF, and the partial A/D converter 12 performs A/D conversion on the partial analog voltage value P1 is connected through the switch SW2, thereby outputting, as the partial digital value 9, [00,01,10,11] which are binary codes each corresponding to 2-bit output and having Mi as a higher-order bit and Li as a lower-order bit.

Furthermore, when the number-of-bits selection signal B2 is 1 level while the other number-of-bits selection signals are 0 level, i.e., when the pipeline A/D converter operates as an A/D converter having resolution of 2-bit precision, the switch SW1 is ON and the other switches are OFF, and the partial A/D converter 12 performs A/D conversion on the partial analog voltage value P0 that is connected through the switch SW1, thereby outputting, as the partial digital value 9, [00,01,10,11] which are binary codes each corresponding to 2-bit output and having Mi as higher-order bits and Li as lower-order bits.

Figure 11:
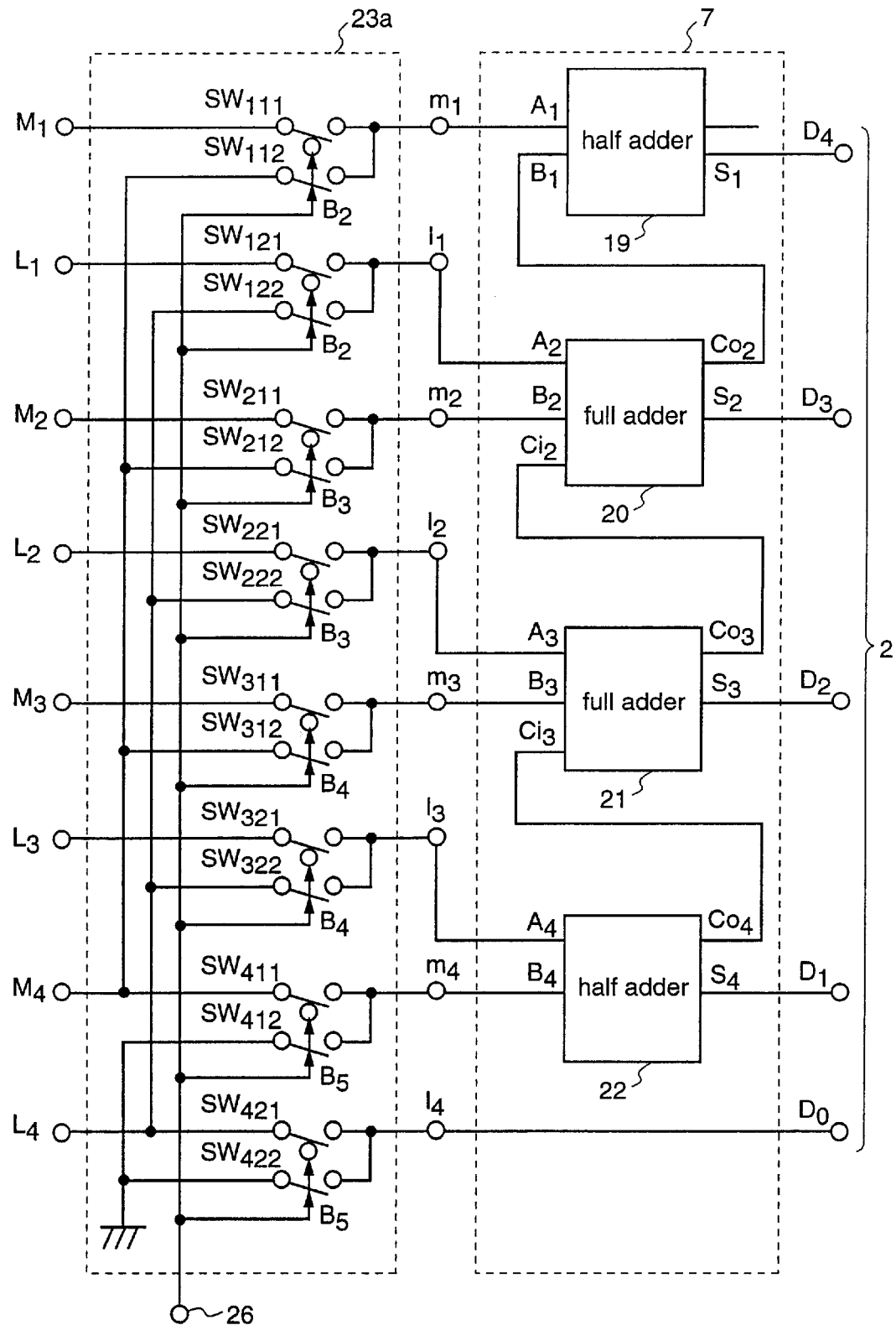
FIG. 11 is a block diagram illustrating a correction code conversion circuit as a component of the pipeline A/D converter according to the second embodiment.

FIG. 11 is a block diagram illustrating the specific constructions of the correction code conversion circuit 23a and the coding circuit 7 which are employed in the pipeline A/D converter according to the second embodiment. The correction code conversion circuit 23a is supplied with the partial digital values M1L1–M4L4 outputted from the first to fourth pipeline stages 3–6, and the number-of-bits selection signals B2–B5, and outputs partial digital values m1l1–m4l4 which are obtained by correcting the partial digital values M1L1–M4L4 according to the number-of-bits selection signals B2–B5. An end of each of switches SW111–SW411 is connected to an end of each of switches SW112–SW412, and the connected ends of these switches are outputted as partial digital values m1–m4. An end of each of switches SW121–SW421 is connected to an end of each of switches SW122–SW422, and the connected ends of these switches are outputted as partial digital values l1–l4 to be connected to the coding circuit 7.

The partial digital values M1–M3 are connected to ends of the switches SW111–SW311, which are not connected to the switches SW112–SW312. Further, the partial digital value M4 is connected to an end of the switch SW411, which is not connected to the switch SW412, and to ends of the switches SW112–SW312, which are not connected to the switches SW111–SW311. On the other hand, the partial digital values L1–L3 are connected to ends of the switches SW121–SW321, which are not connected to the switches SW122–SW322. Further, the partial digital value L4 is connected to an end of the switch SW421, which is not connected to the switch SW422, and to ends of the switches SW122–SW322, which are not connected to the switches SW121–SW321.

Further, ends of the switches SW412 and SW422, which are not connected to the switches SW411 and SW421, are connected to the GND level. The number-of-bits selection signals B2–B5 are connected to the switches SW111–SW411, the switches SW112–SW412, the switches SW121–SW421, and the switches SW122–SW422, to determine the ON/OFF states of the respective switches.

Next, the operation of the correction code conversion circuit 23a employed in the pipeline A/D converter will be described. Among the number-of-bits selection signals B2–B5 inputted to the correction code conversion circuit 23a, one of these signals is 1 level while the others are 0 level. When the number-of-bit selection signal B5 is 1 level while the other number-of-bit selection signals are 0 level, i.e., when the pipeline A/D converter operates as an A/D converter having resolution of 5-bit precision, the switches SW111–SW411 and SW121–SW421 are ON and the switches SW112–SW412 and SW122–SW422 are OFF, whereby the partial digital values M1–M4 are outputted through the switches SW111–SW411 to be the partial digital values m1–m4 without being corrected, respectively, and the partial digital values L1–L4 are outputted through the switches SW121–SW421 to be the partial digital values l1–l4 without being corrected, respectively. The outputted partial digital values m1–m4 and l1–l4 are input to the coding circuit 7.

Likewise, when the number-of-bit selection signal B4 is 1 level while the other number-of-bit selection signals are 0 level, i.e., when the pipeline A/D converter operates as an A/D converter having resolution of 4-bit precision, the switches SW111–SW211, SW312–SW412, SW121–SW221, and SW322–SW422 are ON and the switches SW112–SW212, SW311–SW411, SW122–SW222, and SW321–SW421 are OFF. Thereby, the partial digital values M1, M2, and M4 are outputted through the switches SW111, SW211, and SW312, respectively, the 0 level is output through the switch SW412, the partial digital values M1 and M2 are not corrected, the partial digital value M3 is corrected by the partial digital value M4, and the partial digital value M4 is corrected to the 0 level, resulting in the partial digital values m1–m4. The partial digital values m1–m4 are input to the coding circuit 7. The partial digital values L1, L2, and L4 are outputted through the switches SW121, SW221, and SW322, respectively, the 0 level is output through the switch SW422, the partial digital values L1 and L2 are not corrected, the partial digital value L3 is corrected by the partial digital value L4, and the partial digital value L4 is corrected to the 0 level, resulting in the partial digital values l1–l4. The partial digital values l1–l4 are input to the coding circuit 7.

Further, when the number-of-bit selection signal B3 is 1 level while the other number-of-bit selection signals are 0 level, i.e., when the pipeline A/D converter operates as an A/D converter having resolution of 3-bit precision, the switches SW111, SW212, SW311, SW412, SW121, SW222, SW321, and SW422 are ON and the switches SW112, SW211, SW312, SW411, SW122, SW221, SW322, and SW421 are OFF. Thereby, the partial digital values M1, M4, and M3 are outputted through the switches SW111, SW212, and SW311, respectively, the 0 level is output through the switch SW412, the partial digital values M1 and M3 are not corrected, the partial digital value M2 is corrected by the partial digital value M4, and the partial digital value M4 is corrected to the 0 level, resulting in the partial digital values m1–m4. The partial digital values m1–m4 are input to the coding circuit 7. The partial digital values L1, L4, and L3 are output through the switches SW121, SW222, and SW321, respectively, the 0 level is output through the switch SW422, the partial digital values L1 and L3 are not corrected, the partial digital value L2 is corrected by the partial digital value L4, and the partial digital value L4 is corrected to the 0 level, resulting in the partial digital values l1–l4. The partial digital values l1–l4 are input to the coding circuit 7.

Furthermore, when the number-of-bit selection signal B2 is 1 level while the other number-of-bit selection signals are 0 level, i.e., when the pipeline A/D converter operates as an A/D converter having resolution of 2-bit precision, the switches SW112, SW211–SW311, SW412, SW122, SW221–SW321, and SW422 are ON and the switches SW111, SW212–SW312, SW411, SW121, SW222–SW322, and SW421 are OFF. Thereby, the partial digital values M4, M2, and M3 are output through the switches SW112, SW211, and SW311, respectively, the 0 level is output through the switch SW412, the partial digital values M2 and M3 are not corrected, the partial digital value M1 is corrected by the partial digital value M4, and the partial digital value M4 is corrected to the 0 level, resulting in the partial digital values m1–m4. The partial digital values m1–m4 are input to the coding circuit 7. The partial digital values L4, L2, and L3 are output through the switches SW122, SW221, and SW321, respectively, the 0 level is output through the switch SW422, the partial digital values L2 and L3 are not corrected, the partial digital value L1 is corrected by the partial digital value L4, and the partial digital value L4 is corrected to the 0 level, resulting in the partial digital values l1–l4. The partial digital values l1–l4 are input to the coding circuit 7.

While in FIG. 11 the correction code conversion circuit 23a selects the partial digital values M1L1–M4L4 using the switches, it may be constituted by other circuits than the switches so long as the circuits can select the digital values.

As described above, according to the pipeline A/D converter of the second embodiment, when resolution of a digital output signal requested by the system varies over a range of 2–5 bits, a series of pipeline operations performed at the pipeline stages whose operations are not needed can be halted, whereby power consumption of the pipeline A/D-converter is reduced. Simultaneously, even when the pipeline operations of the pipeline stages which output the partial digital values that are not required for constituting the digital value to be output, are halted, resolution of the digital value to be output can be compensated.

While in this second embodiment a pipeline A/D converter which can vary resolution of a digital output signal over a range of 2–5 bits is described, the number of bits of the digital output signal may be set to an arbitrary value equal to or larger than 2.

Further, while in this second embodiment an A/D converter in which a partial digital value to be outputted from each pipeline stage is 1.5 bits or 2 bits is described, the number of bits of the partial digital value to be output from each pipeline stage may be arbitrarily set.

Embodiment 3

Figure 12:
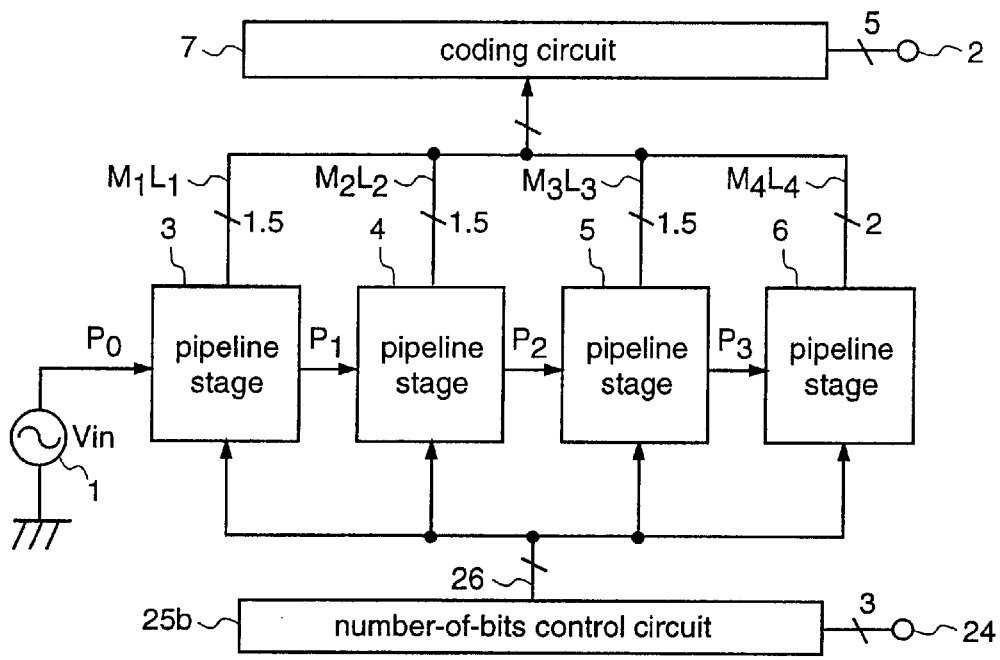
FIG. 12 is a block diagram illustrating the construction of a pipeline A/D converter according to a third embodiment of the invention.

FIG. 12 is a block diagram illustrating the construction of a pipeline A/D converter according to a third embodiment of the present invention, which can change resolution of a digital output signal over a range of 1–3 bits, or to 5 bits.

The pipeline A/D converter according to the third embodiment is supplied with an analog input signal 1, and outputs a digital output signal 2. To be specific, the analog input signal 1 indicated by a partial analog voltage P0 is input to a first pipeline stage 3. An output of the first pipeline stage 3, which is indicated by a partial analog voltage value P1, is input to a second pipeline stage 4. An output of the second pipeline stage 4, which is indicated by a partial analog voltage value P2, is input to a third pipeline stage 5. An output of the third pipeline stage 5, which is indicated by a partial analog voltage value P3, is input to a fourth pipeline stage 6. Partial digital values M1L1–M4L4 obtained in the respective pipeline stages are connected to a coding circuit 7. On the other hand, a number-of-bits control signal 24 is connected to a number-of-bits control circuit 25b, and a number-of-bits selection signal 26 as an output of the number-of-bits control circuit 25b is connected to the first to fourth pipeline stages 3–6.

Next, the operation of the pipeline A/D converter according to the third embodiment will be described. Initially, a description will be given of a case where the pipeline A/D converter outputs a digital output signal having 5-bit resolution. When the number-of-bits control signal 24 for outputting a digital output signal having 5-bit resolution is applied to the number-of-bits control circuit 25b, the number-of-bits control circuit 25b outputs the number-of-bits selection signal 26 so as to operate the first to fourth pipeline stages 3–6. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the coding circuit 7 and the second pipeline stage 4, respectively. Likewise, when the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the coding circuit 7 and the third pipeline stage 5, respectively. Likewise, when the partial analog voltage value P2 is input to the third pipeline stage 5, the third pipeline stage 5 outputs the partial digital value M3L3 which is a binary code having 1.5 bits of information, and the partial analog voltage value P3, according to the partial analog voltage value P2. The partial digital value M3L3 and the partial analog voltage value P3 are input to the coding circuit 7 and the fourth pipeline stage 6, respectively. When the partial analog voltage value P3 is input to the fourth pipeline stage 6, the fourth pipeline stage 6 outputs the partial digital value M4L4 which is a binary code having 2 bits of information and constitutes a least significant bit of the digital output signal 2, according to the partial analog voltage value P3, and the partial digital-value M4L4 is input to the coding circuit 7. The coding circuit 7 codes the inputted partial digital values to output the digital output signal 2 which is a binary code and has 5-bit resolution.

Next, a description will be given of the operation of the pipeline A/D converter when it outputs a digital output signal having 3-bit resolution. When the number-of-bits control signal 24 for outputting a digital output signal having 3-bit resolution is input to the number-of-bits control circuit 25b, the number-of-bits control circuit 25b outputs the number-of-bits selection signal 26 so as to operate the first to third pipeline stages 3–5, and halt the fourth pipeline stage 6. It is assumed that the halted fourth pipeline stage 6 outputs [00] as the partial digital value M4L4. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the coding circuit 7 and the second pipeline stage 4, respectively.

When the partial analog voltage value P1 is input to the second pipeline stage 4, the second pipeline stage 4 outputs the partial digital value M2L2 which is a binary code having 1.5 bits of information, and the partial analog voltage value P2, according to the partial analog voltage value P1. The partial digital value M2L2 and the partial analog voltage value P2 are input to the coding circuit 7 and the third pipeline stage 5, respectively. When the partial analog voltage value P2 is input to the third pipeline stage 5, the third pipeline stage 5 outputs the partial digital value M3 which is a binary code having 1 bit of information, and a 0 level as the partial digital value L3, according to the partial analog voltage value P2. The partial digital value M3 and the 0 level are input to the coding circuit 7. The fourth pipeline stage 6 outputs [00] as the partial digital value M4L4 to the coding circuit 7. The coding circuit 7 codes the M1L1–M4L4, actually, M1L1–M3L3, thereby outputting the digital output signal 2 which is a binary code and has 3-bit resolution.

Next, a description will be given of the operation of the pipeline A/D converter when it outputs a digital output signal having 2-bit resolution. When the number-of-bits control signal 24 for outputting a digital output signal having 2-bit resolution is input to the number-of-bits control circuit 25b, the number-of-bits control circuit 25b outputs the number-of-bits selection signal 26 so as to operate the pipeline stages 3 and 4, and halt the pipeline stages 5 and 6. It is assumed that the halted pipeline stages 5 and 6 output [00] as the partial digital values M3L3 and M4L4, respectively. At this time, when the analog input signal 1 is input to the first pipeline stage 3, the first pipeline stage 3 outputs the partial digital value M1L1 which is a binary code having 1.5 bits of information and constitutes a most significant bit of the digital output signal 2, and the partial analog voltage value P1, according to the analog input signal 1. The partial digital value M1L1 and the partial analog voltage value P1 are input to the coding circuit 7 and the second pipeline stage 4, respectively.

When the partial analog voltage value P1 is input to the second pipeline stage 4, the second pipeline stage 4 outputs the partial digital value M2 which is a binary code having 1 bit of information, and a 0 level as the partial digital value L2, according to the partial analog voltage value P1. The partial digital value M2 and the 0 level are input to the coding circuit 7. The pipeline stages 5 and 6 output [00] as the partial digital values M3L3 and M4L4 to the coding circuit 7. The coding circuit 7 codes the M1L1–M4L4, actually, M1L1–M2L2, thereby outputting the digital output signal 2 which is a binary code and has 2-bit resolution.

Next, a description will be given of the operation of the pipeline A/D converter when it outputs a digital output signal having 1-bit resolution. When the number-of-bits control signal 24 for outputting a digital output signal having 1-bit resolution is input to the number-of-bits control circuit 25b, the number-of-bits control circuit 25b outputs the number-of-bits selection signal 26 so as to operate the pipeline stage 3, and halt the pipeline stages 4–6. It is assumed that the halted pipeline stages 4–6 output [00] as the partial digital values M2L2–M4L4, respectively. At this time, when the analog input signal 1 is input to the first pipeline stage 3, the first pipeline stage 3 outputs the partial digital value M1 which is a binary code having 1 bit of information, and a 0 level as the partial digital value L1, according to the analog input signal 1. The partial digital value M1 and the 0 level are input to the coding circuit 7. The partial digital value M2 and the 0 level are input to the coding circuit 7. The pipeline stages 4–6 outputs [00] as the partial digital values M2L2–M4L4 to the coding circuit 7. The coding circuit 7 codes the M1L1–M4L4, actually, M1L1, thereby outputting the digital output signal 2 which is a binary code and has 1-bit resolution.

Figure 13:
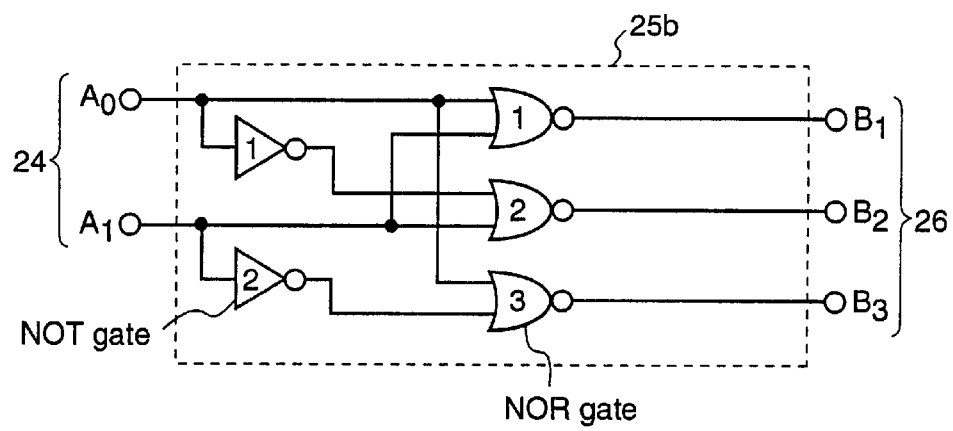
FIG. 13 is a block diagram illustrating a number-of-bits control circuit as a component of the pipeline A/D converter according to the third embodiment.

FIG. 13 is a block diagram illustrating the specific construction of the number-of-bits control circuit 25b employed in the pipeline A/D converter according to the third embodiment. the number-of-bits control signal A0 is connected to the first NOT gate and to the first input terminals of the first and third NOR gates, and the number-of-bits control signal A1 is connected to the second NOT gate and to the second input terminals of the first and second NOR gates. An output of the first NOT gate is connected to the first input terminal of the second NOR gate, and an output of the second NOT gate is connected to the second input terminal of the third NOR gate. An output of the first NOR gate is outputted as a bit selection signal 26 indicated by B1, an output of the second NOR gate is outputted as a bit selection signal 26 indicated by B2, and an output of the third NOR gate is outputted as a bit selection signal 26 indicated by B3.

Next, the operation of the number-of-bits control circuit 25b employed in the pipeline A/D converter will be described in detail. When [00] is input to the number-of-bits control signals A1–A0, only the output of the first NOR gate becomes 1 level while the outputs of the second and third NOR gates become 0 level, whereby the number-of-bits selection signals B3–B1 [001] are outputted. When [01] is input to the number-of-bits control signals A1–A0, only the output of the second NOR gate becomes 1 level while the outputs of the first and third NOR gates become 0 level, whereby the number-of-bits selection signals B3–B1 [010] are outputted. When [10] is input to the number-of-bits control signals A1–A0, only the output of the third NOR gate becomes 1 level while the outputs of the first and second NOR gates become 0 level, whereby the number-of-bits selection signals B3–B1 [100] are outputted. When [11] is input to the number-of-bits control signals A1–A0, the outputs of the first to third NOR gates become 0 level, whereby the number-of-bits selection signals B3–B1 [000] are outputted.

When all of the number-of-bits selection signal B3–B1 indicate 0 level, the pipeline A/D converter operates as an A/D converter having resolution of 5-bit precision. Likewise, when the number-of-bits selection signal B3 indicates 1 level while the other number-of-bits selection signals indicate 0 level, the pipeline A/D converter operates as an A/D converter having resolution of 3-bit precision. Likewise, when the number-of-bits selection signal B2 indicates 1 level while the other number-of-bits selection signals indicate 0 level, the pipeline A/D converter operates as an A/D converter having resolution of 2-bit precision. Likewise, when the number-of-bits selection signal B1 indicates 1 level while the other number-of-bits selection signals indicate 0 level, the pipeline A/D converter operates as an A/D converter having resolution of 1-bit precision.

While in FIG. 13 the number-of-bits control circuit 25b is constituted using the NOT gates and the NOR gates, it may be constituted by other logic circuits with the same effects as mentioned above.

Further, in FIG. 13, when the logical states of the number-of-bits control signals A1–A0 are [00], [01], [10], and [11], the number-of-bits selection signals B3–B1 are outputted as [001], [010], [100], and [000], respectively. However, the logical states of the number-of-bits control signals A1–A0 may be arbitrarily selected so long as the number-of-bits selection signals B3–B1 are uniquely determined with respect to the number-of-bits control signals A1–A0, and the circuits receiving the number-of-bits selection signals B3–B1 correspond to the logical states, so that the same effects as mentioned above are obtained.

Furthermore, in FIG. 13, only one selection signal among the number-of-bits selection signals B3–B1 is outputted as 1 level while the remaining two selection signals are outputted as 0 level. However, the same effects as mentioned above can be achieved even when only one selection signal among the number-of-bits selection signals B3–B1 is output as 0 level while the remaining two selection signals are output as 1 level, or when arbitrary logical states are output as the number-of-bits selection signals B3–B1, so long as the number-of-bits selection signals B3–B1 are uniquely determined with respect to the number-of-bits control signals A1–A0, and the circuits receiving the number-of-bits selection signals B3–B1 correspond to the logical states.

Figure 14:
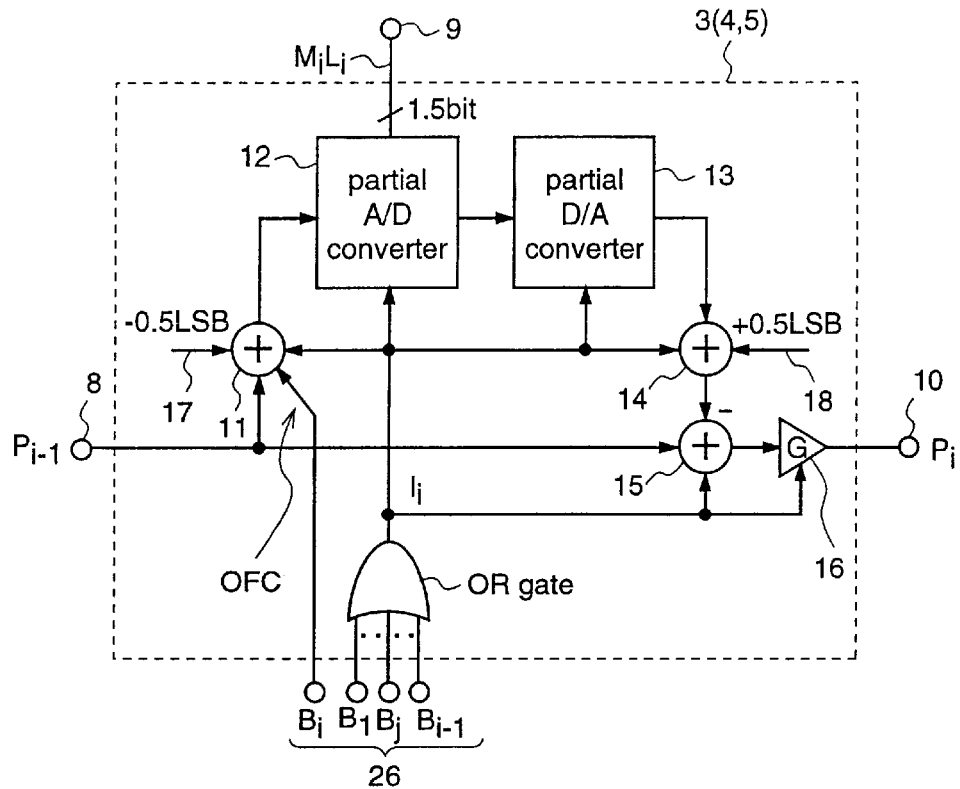
FIG. 14 is a block diagram illustrating each of first to third pipeline stages as components of the pipeline A/D converter according to the third embodiment.

Hereinafter, the constructions of the i-th (first to fourth) pipeline stages will be described. FIG. 14 is a block diagram illustrating the construction of each of the first to third pipeline stages 3–5 employed in the pipeline A/D converter according to the third embodiment. Each of the first to third pipeline stages 3–5 is supplied with, as an input, a first partial analog voltage value 8 indicated by Pi−1, and outputs a partial digital value 9 indicated by MiLi, and a second partial analog voltage value 10 indicated by Pi. Further, the pipeline stage is supplied with, as inputs, the number-of-bits selection signals B1–Bi (26), and determines whether a series of pipeline operations should be carried out or halted, and whether a first offset voltage value should be added or not, according to the number-of-bits selection signals B1–Bi. The first partial analog voltage value 8 is input to a first offset addition unit 11. An output of the first offset addition unit 11 is input to a partial A/D converter 12. An output of the partial A/D converter 12 is input to a partial D/A converter 13. An output of the partial D/A converter 13 is input to a second offset addition unit 14. An output of the second offset addition unit 14 and the first partial analog voltage value 8 are input to a subtracter 15. An output of the subtracter 15 is input to an arithmetic amplifier 16. An output of the arithmetic amplifier 16 becomes the second partial analog voltage value 10. Further, the first offset addition unit 11 is supplied to a bit selection signal Bi, thereby constituting an offset control means OFC which controls as to whether offset addition should be performed or not, according to the bit selection signal Bi.

Only the number-of-bits selection signal B1 is connected to an OR circuit (26) in the second pipeline stage, and the number-of-bits selection signals B1–B2 (i.e., the number-of-bits selection signals B1–Bi−1) are connected to an OR circuit (26) in the third pipeline stage 5. An output Ii of the OR circuit (26) is connected to the first offset addition unit 11, the partial A/D converter 12, the partial D/A converter 13, the second offset addition unit 14, the subtracter 15, and the arithmetic amplifier 16, and it is determined whether each circuit should be operated or not, according to the output Ii of the OR circuit (26).

Since the first pipeline stage is always operated, it needs no OR circuit. The number-of-bit selection signal Bi is connected to the first offset addition unit 11.

Figure 15:
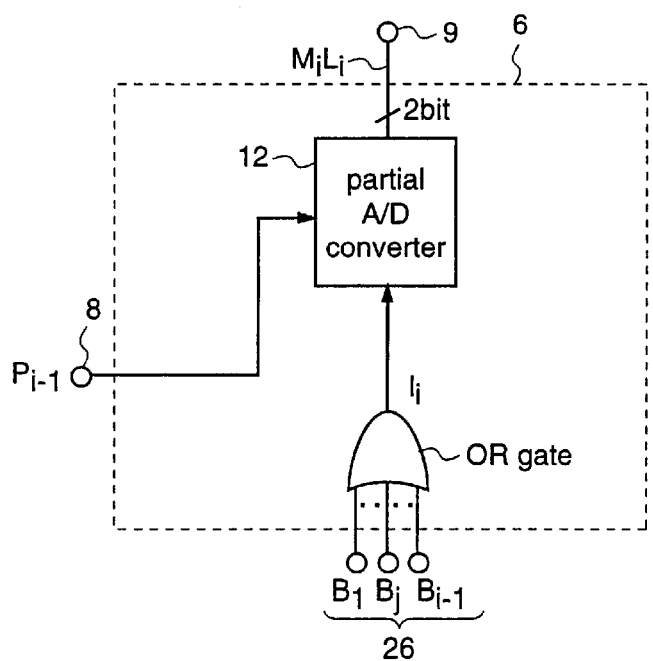
FIG. 15 is a block diagram illustrating a fourth pipeline stage as a component of the pipeline A/D converter according to the third embodiment.

FIG. 15 is a block diagram illustrating the fourth pipeline stage 6 which is employed in the pipeline A/D converter according to the third embodiment. The fourth pipeline stage is supplied with, as inputs, the first partial analog voltage value 8 indicated by Pi−1, and the number-of-bits selection signals B1–B3 (26), and outputs the partial digital value 9 indicated by MiLi. The first partial analog voltage value 8 is input to the A/D converter 12.

Figure 25:
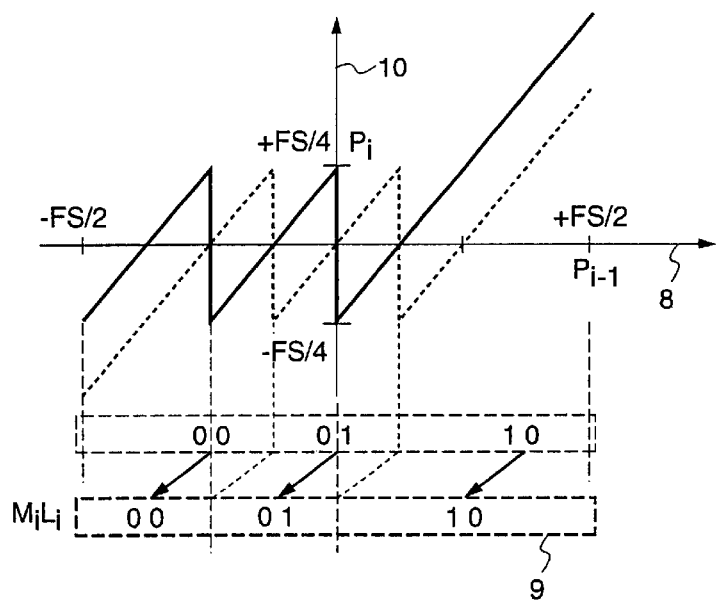
FIG. 25 is a diagram illustrating an input-output relationship in each of the first to third pipeline stages of the A/D converter according to the third embodiment.
Figure 26:
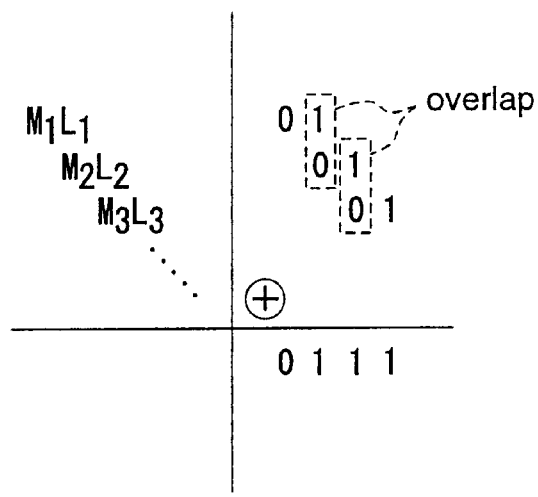
FIG. 26A is a diagram illustrating the digital output of a pipeline stage having an overlap portion with the digital output of a pipeline stage constituting the higher-order bit.
FIG. 26B is a diagram illustrating the digital output of the pipeline stage shown in FIG. 26A with an arithmetic result that halts the pipeline stage.
Figure 26:
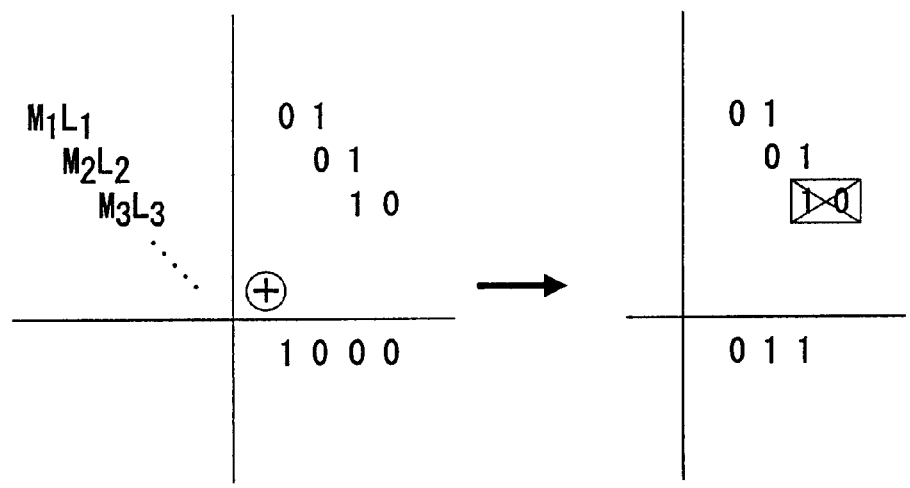

Hereinafter, the operations of the i-th (first to fourth) pipeline stages employed in the pipeline A/D converter will be described with reference to FIG. 25. In the first pipeline stage 3, when the number-of-bits selection signal B1 is 0 level, i.e., when the pipeline A/D converter operates as an A/D converter having resolution equal to or higher than 2-bit precision, a series of pipeline operations is carried out as usual. In the second and third pipeline stages 4 and 5, when all of the inputted number-of-bits selection signals B1–Bi are 0 level, i.e., when the pipeline A/D converter operates as an A/D converter having resolution equal to or higher than (i+1)-bit precision, the output Ii from the OR circuit (26) becomes 0 level. At this time, a series of pipeline operations is carried out as usual. The first offset addition unit 11 adds an offset voltage value equivalent to −0.5 LSB, as a first offset voltage value 17, to the Pi−1 that is the inputted partial analog voltage value 8, and then the partial A/D converter 12 performs A/D conversion on the Pi−1, thereby outputting, as the partial digital value 9, [00,01,10] which are binary codes each corresponding to 1.5-bit output and having Mi as a higher-order bit and Li as a lower-order bit.

Furthermore, the partial D/A converter 13 performs D/A conversion on the partial digital value 9, and the second offset addition unit 14 adds an offset voltage value equivalent to +0.5 LSB to the result of the D/A conversion, as a second offset voltage value 18. Then, an output of the second offset addition unit 14 and the first partial analog voltage value 8 are input to the subtracter 15, and a difference voltage value between them is obtained. Thereafter, the difference voltage value is amplified by the arithmetic amplifier 16 to obtain the Pi as the second partial analog voltage value 10.

On the other hand, when at least one of the inputted number-of-bits selection signals B1–Bi–1 is 1 level, i.e., when the pipeline A/D converter operates as an A/D converter having resolution equal to or lower than (i–1)-bit precision, the output Ii from the OR circuit becomes 1 level. At this time, the first offset addition unit 11, the partial A/D converter 12, the partial D/A converter 13, the second offset addition unit 14, the subtracter 15, and the arithmetic amplifier 16 halt their operations. The partial A/D converter 12 outputs [00] as the partial digital value 9 indicated by MiLi. On the other hand, when the inputted number-of-bit selection signal Bi is 1 level, i.e., when the pipeline A/D converter operates as an A/D converter having resolution of i-bit precision, the number-of-bit selection signal Bi is input to the first offset addition unit 11 to halt the offset addition operation.

Figure 16:
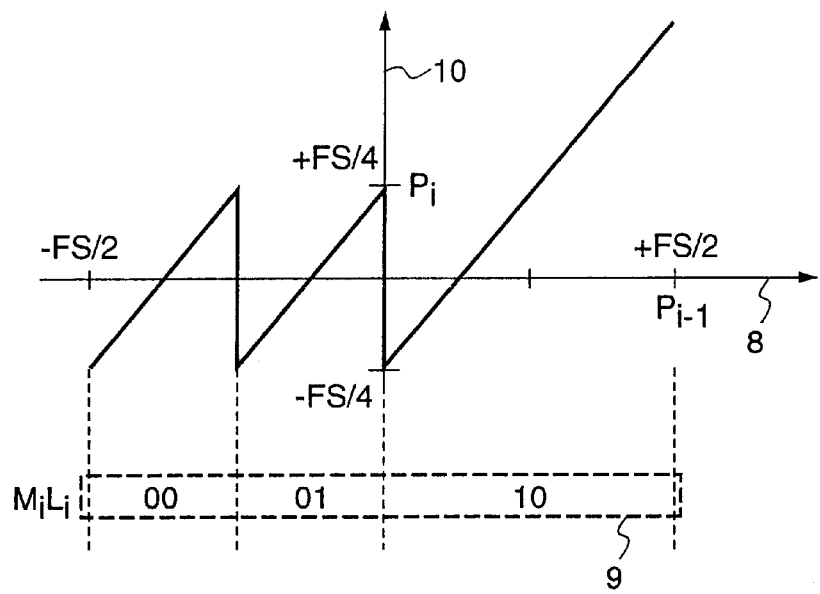
FIG. 16 is a diagram illustrating an input-output relationship in each of the first to third pipeline stages included in the pipeline A/D converter according to the third embodiment.
Figure 17:
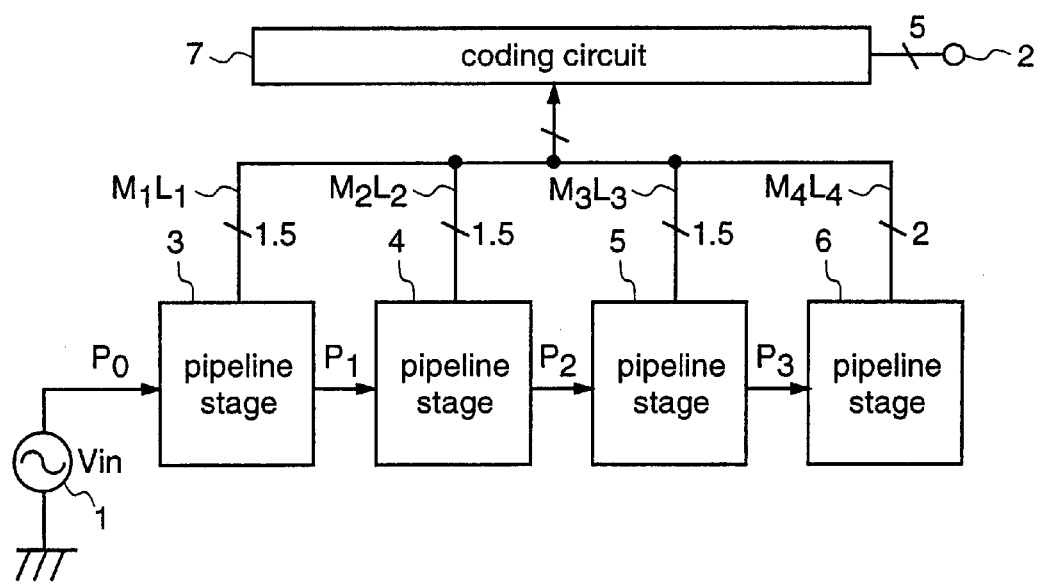
FIG. 17 is a block diagram illustrating the construction of a conventional pipeline A/D converter.
Figure 18:
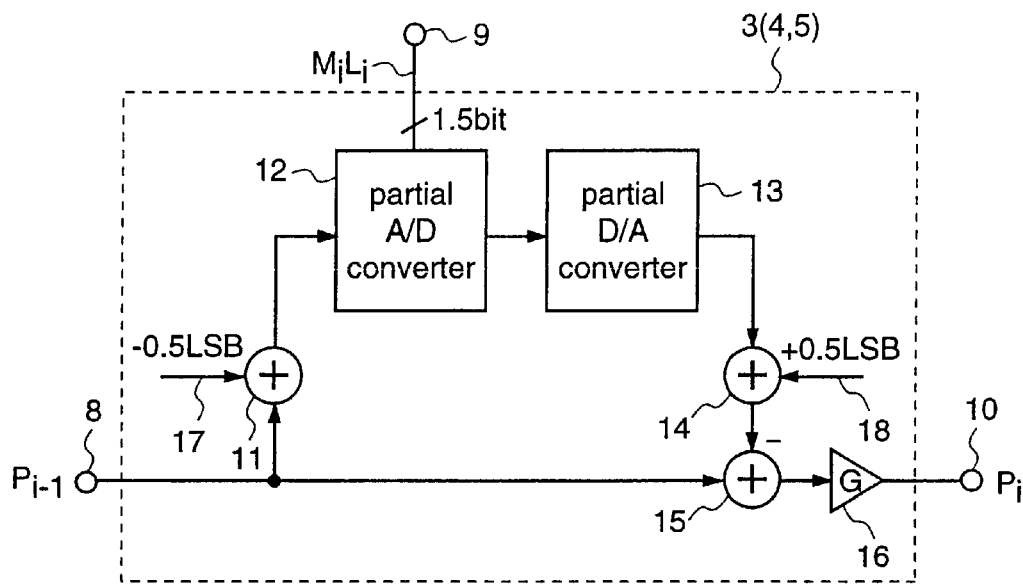
FIG. 18 is a block diagram illustrating each of first to third pipeline stages as components of the conventional pipeline A/D converter.
Figure 19:
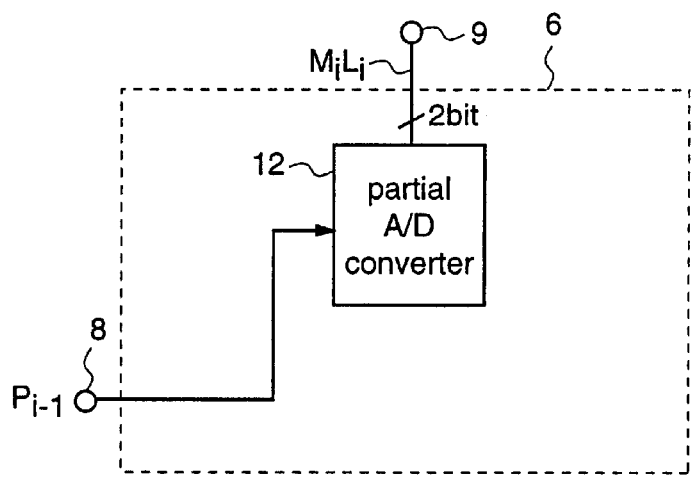
FIG. 19 is a block diagram illustrating a fourth pipeline stage as a component of the conventional pipeline A/D converter.
Figure 20:
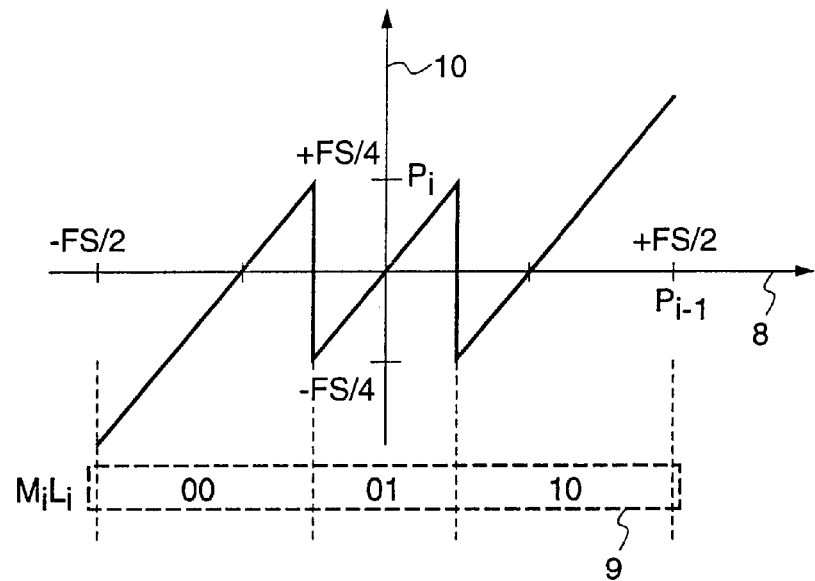
FIG. 20 is a diagram illustrating an input-output relationship in each of the first to third pipeline stages of the conventional pipeline A/D converter.
Figure 21:
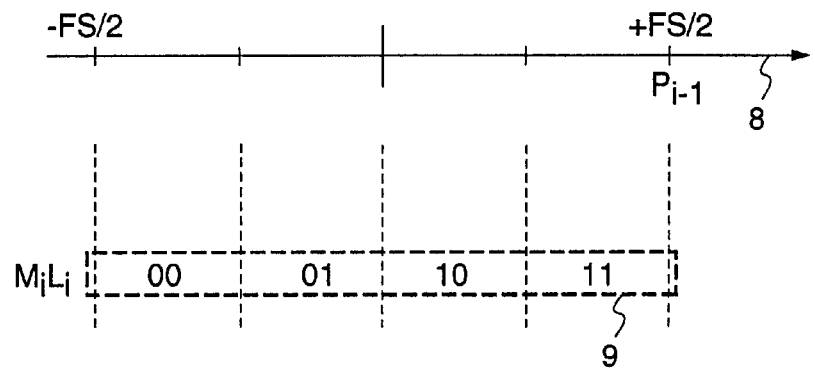
FIG. 21 is a diagram illustrating an input-output relationship in the fourth pipeline stage as a component of the conventional pipeline A/D converter.
Figure 22:
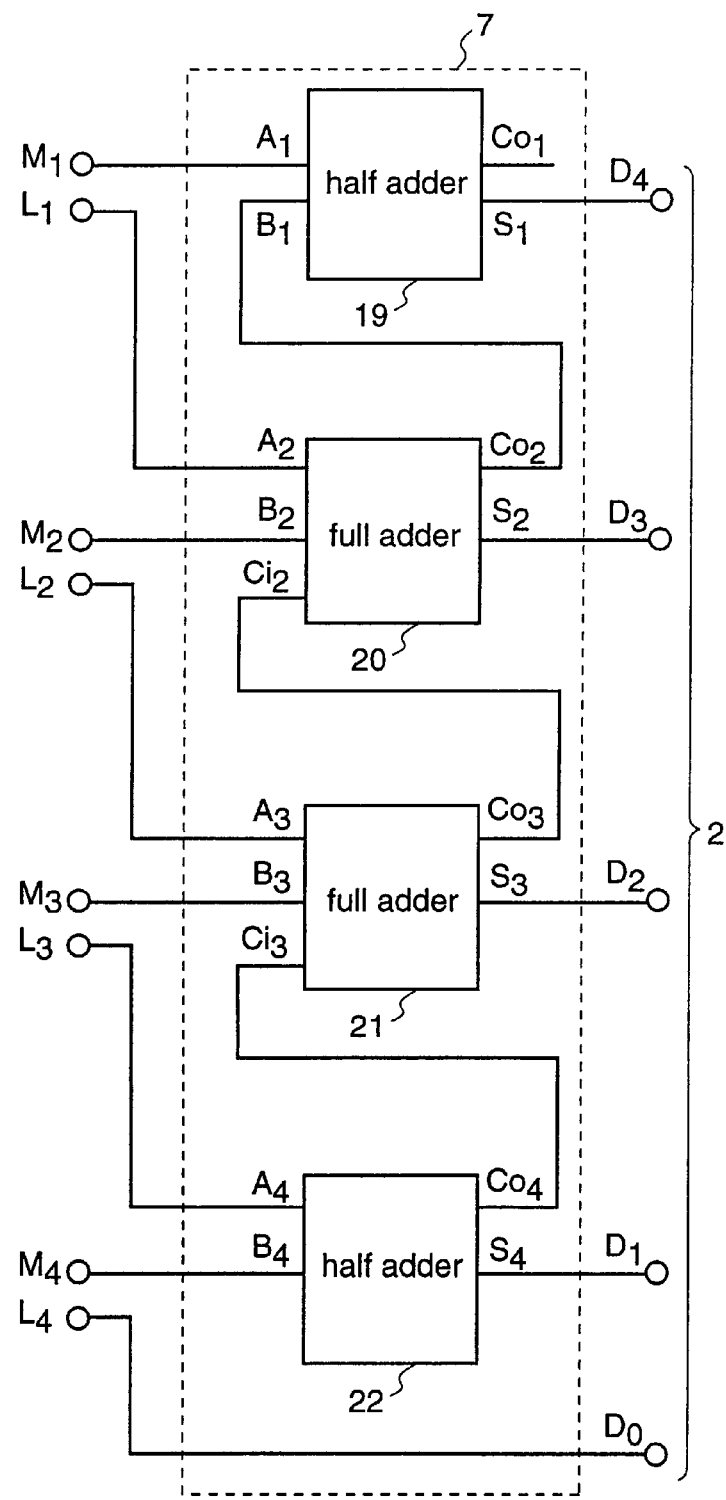
FIG. 22 is a block diagram illustrating a coding circuit as a component of the conventional pipeline A/D converter.

Thereby, the relationship of the first partial analog voltage value Pi–1 as an input, to the partial digital value MiLi and the second partial analog voltage value Pi as outputs, changes from the input-output relationship shown in FIG. 20 to the input-output relationship shown in FIG. 16. That is, the 0 level is outputted as the partial digital value Mi when the first partial analog voltage value Pi–1 is lower than the GND level, and the 1 level is outputted as the partial digital value Mi when the first partial analog voltage value Pi–1 is higher than the GND level. At this time, assuming that the 0 level is output as the partial digital value Li, the partial digital value Mi as the output of the i-th pipeline stage has no overlap with the partial digital values Mi+1Li+1–M4L4 which are outputted from the (i+1)th pipeline stage and subsequent pipeline stages, whereby an output of i-bit precision can be determined by only–the i-th pipeline stage.

On the other hand, in the fourth pipeline stage 6, when all of the inputted number-of-bits selection signals B1–B3 are 0 level, i.e., when the pipeline A/D converter severs as an A/D converter having resolution of 5-bit precision, the output Ii from the OR circuit (26) becomes 0 level. At this time, a series of pipeline operations is carried out as usual. The partial analog voltage value Pi–1 is subjected to A/D conversion, thereby outputting, as the partial digital value 9, [00,01,10,11] which are binary codes each corresponding to 2-bit output and having Mi as a higher-order bit and Li as a lower-order bit. Further, when at least one of the number-of-bits selection signals B1–B3 is 1 level, i.e., when the pipeline A/D converter operates as an A/D converter having resolution equal to or lower than 3-bit precision, the output Ii from the OR circuit (26) becomes 1 level. At this time, the A/D converter 12 halts its operation. The partial A/D converter 12 outputs [00] as the partial digital value 9 indicated by MiLi.

As described above, according to the pipeline A/D converter of the third embodiment, when resolution of a digital output signal requested by the system changes over a range of 1–3 bits, or to 5 bits, a series of pipeline operations performed at the pipeline stages whose operations are not needed can be halted, whereby power consumption of the pipeline A/D converter is reduced. Simultaneously, even when the pipeline operations of the pipeline stages which output the partial digital values that are not necessary in constructing the digital value to be output, are halted, precision of the digital value to be output can be compensated.

While in this third embodiment a pipeline A/D converter which can change resolution of a digital output signal over a range of 1–3 bits or to 5 bits is described, the number of bits of a digital output signal can be arbitrarily set, like 1–n–2 bits or n bits, by changing the number of the pipeline stages.

Furthermore, while in this third embodiment an A/D converter in which a partial digital value outputted from each pipeline stage is 1.5 bits or 2 bits is described, the number of bits of the partial digital value outputted from each pipeline stage can be arbitrarily set.

What is claimed is:

1. An A/D converter comprising:
a pipeline stage array in which plural pipeline stages are connected in series, each pipeline stage for performing a pipeline operation on an inputted analog voltage to output a digital voltage;
a number-of-bits control circuit for outputting a number-of-bits selection signal which indicates whether the operation of each pipeline stage should be carried out or halted, according to a number-of-bits control signal which indicates a resolution; and
a correction circuit for compensating a digital value to be output, according to the number-of-bits control signal.

2. An A/D converter as defined in claim 1, wherein said correction circuit comprises:
a correction A/D converter for receiving inputs of all of the pipeline stages, comparing an input that is selected from the inputs according to the number-of-bits selection signal, with a reference voltage value, and outputting a result of comparison as a first partial digital value for correction which comprises at least one binary code; and
a correction code conversion circuit for receiving second partial digital values which are outputted from all of the pipeline stages in the pipeline stage array, and the first partial digital value for correction which is outputted from the correction A/D converter, and outputting at least one binary code according to the number-of-bits selection signal.

3. An A/D converter as defined in claim 1, wherein said correction circuit comprises:
a selection means for selecting an analog voltage value to be processed in a final pipeline stage, from among analog voltage values which are outputted from the plural pipeline stages except the final pipeline stage, according to the number-of-bits selection signal; and
a correction code conversion circuit for receiving a partial digital value outputted from the final pipeline stage, and partial digital values outputted from the respective pipeline stages in the pipeline stage array other than the final pipeline stage, and outputting corrected binary codes according to the number-of-bits selection signal.

4. An A/D converter as defined in claim 1, wherein said correction circuit comprises:
an offset control means for determining whether offset addition should be performed in the plural pipeline stages except the final pipeline stage, according to the number-of-bits control signal, and controlling the plural pipeline stages to output corrected binary codes.

* * * * *